United States Patent
Degani et al.

(10) Patent No.: US 12,483,210 B2
(45) Date of Patent: Nov. 25, 2025

(54) DUAL FEEDBACK STACKING METHOD FOR INCREASING DIGITAL POWER AMPLIFIER SUPPLY RANGE

(71) Applicant: Intel Corporation, Santa Clara, CA (US)

(72) Inventors: Ofir Degani, Nes-Ammin (IL); Assaf Ben-Bassat, Haifa Ha (IL); Yishai Eilat, Alonei Aba (IL); Naor Roi Shay, Rehovot (IL); Limor Zohar, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 731 days.

(21) Appl. No.: 17/705,641

(22) Filed: Mar. 28, 2022

(65) Prior Publication Data

US 2023/0327618 A1   Oct. 12, 2023

(51) Int. Cl.
 H03F 3/24   (2006.01)
 H03F 1/02   (2006.01)
 H03F 1/22   (2006.01)
 H03F 3/45   (2006.01)

(52) U.S. Cl.
 CPC ........... *H03F 3/245* (2013.01); *H03F 1/0227* (2013.01); *H03F 1/223* (2013.01); *H03F 3/45475* (2013.01); *H03F 2200/61* (2013.01)

(58) Field of Classification Search
 CPC .... H03F 3/245; H03F 1/0227; H03F 3/45475; H03F 2200/61; H03F 1/223; H03F 2200/121
 USPC ......................................................... 330/283
 See application file for complete search history.

(56) References Cited

U.S. PATENT DOCUMENTS

| 6,693,469 | B2* | 2/2004 | Prodanov | ......... H03K 19/00315 |
| | | | | 327/170 |
| 8,860,497 | B1* | 10/2014 | Pattnayak | .......... H03K 17/0822 |
| | | | | 327/108 |
| 10,630,296 | B2* | 4/2020 | Lee | ......................... H01L 24/16 |

OTHER PUBLICATIONS

Degani, et al.; U.S. Appl. No. 17/323,189, filed May 18, 2021.

\* cited by examiner

*Primary Examiner* — Andrea Lindgren Baltzell
*Assistant Examiner* — Lance Torbjorn Bartol
(74) *Attorney, Agent, or Firm* — Banner & Witcoff, Ltd.

(57) ABSTRACT

Techniques are disclosed to instruct how a switched capacitor digital power amplifier (PA) is configured to operate using high supply voltage levels beyond twice the maximum voltage rating for any of the transistor terminals such as Vds/Vdg/Vsg. The digital PA has a topology that comprises a dual-feedback capacitive path that comprises a capacitive divider and a voltage stabilizing feedback path to selectively couple the capacitive divider to DC bias voltages.

20 Claims, 13 Drawing Sheets

DUAL FEEDBACK STACKING METHOD FOR INCREASING DIGITAL POWER AMPLIFIER SUPPLY RANGE

TECHNICAL FIELD

Aspects described herein generally relate to digital power amplifier architectures and, more particularly, to digital power amplifier designs that facilitate an increased output power and supply range.

BACKGROUND

Recently, there has been a shift towards digital transmitter (DTX) architectures due to their compact die area, scalability in advance CMOS processes, and improved power efficiency of switching digital power amplifiers (DPAs). Conventional DPAs are based on switched capacitor (SC-DPA) topology, which is typically very efficient. However, conventional DPAs have drawbacks especially in terms of limited output power in that SC-DPA topology implements a low supply voltage due to the digital nature of the design and the use of thin gate digital devices to allow for high speed operation.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1A:
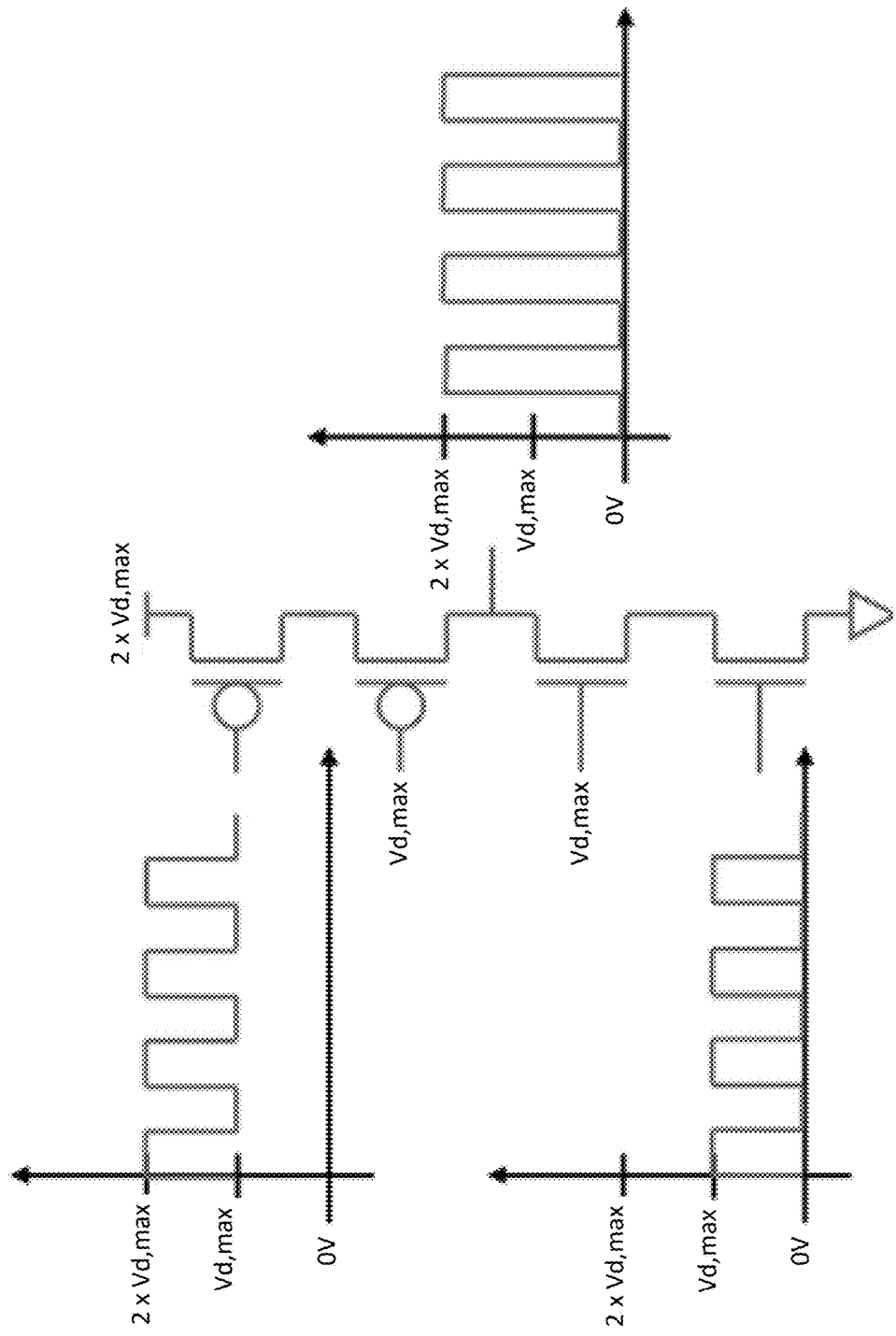
FIG. 1A illustrates an exemplary block diagram of conventional digital power amplifier (DPA) driver cell.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Recently, there has been an increasing demand to increase transceiver transmit power for certain protocols, such as WiFi, to allow higher range across the Modulation Coding Scheme (MCS). Moreover, the use of DTX topologies in cellular applications has been limited due to the higher output power requirements of the cellular standards.

To address these issues, the disclosure proposes various techniques and circuit implementations that allow for a switched capacitor digital power amplifier (DPA) that operates using high supply voltage levels beyond twice the maximum voltage rating for any of the transistor terminals such as Vds/Vdg/Vsg. The notation used herein implements the term "max" after the relevant transistor voltage such as Vds,max; Vdg,max; Vsg,max. The general term Vd,max represents the maximum voltage allowed across any terminals of a single transistor device in accordance with a particular manufacturer's specification.

Previous approaches to increase digital transmitter power include the use of multiple (e.g. 2 and 4) core power combining techniques. However, maintaining the source voltage VDD~Vds,max as power is increased results in a higher current, which results in higher IR drops and more demanding requirements from the DC-DC current rating (handling), and thus impacts efficiency. Moreover, such approaches require an effective load impedance to be presented to each of the cores to be decreased, thus resulting in higher impact of matching network resistive losses (assuming similar Q in the technology). Such implementations also have practical limitations beyond 4 cores.

Other conventional approaches include using the power supply voltage VDD~2Vds,max in 2 stacked devices to increase the digital transmitter power by up to 6 dB compared to a regular single stack device, thus reducing the current consumption. However, typical platforms still require additional DC-DC converters to generate VDD (e.g. 16FF Vds,max~1.2V and a typical platform supply is 3.3V>2.4V). Thus, DC-DC current rating and efficiency impacts the overall efficiency and increases the cost of such designs. Furthermore, such techniques cannot be extended beyond VDD~2Vds,max due to reliability concerns.

Other recent approaches, which are discussed in further detail below, address these issues using a single capacitive feedback path topology that increases the switched capacitor DPA supply voltage using increased transistor stacking in the DPA driver cells, which results in an equal division of the voltage stress on each transistor. The reliability risk is eliminated by floating the internal (close to output) transistor gates, and through the use of a proper capacitive divider, allowing the transistor gates to track the output and reducing the stress over the oxide.

Such architectures advantageously allow for an increased voltage supply to support higher output power required for longer distance transmissions. Although transistor stacking may appear to increase the Ron, there is a net efficiency improvement due to lower currents and an improvement in I²Ron loss, and even in supply network IR drop and losses. Furthermore, the increased VDD results in higher load impedances, and thus a better trade-off of power/efficiency resulting in wider load pull circles and less sensitivity to changes in the load. Finally, such architectures allow for the removal of high power DC-DC converters, resulting in a cost reduction, and facilitates an improvement to efficiency while in transmit mode.

However, such single capacitive feedback DPA topologies may exhibit dynamic effects due to the parasitic nature of the capacitive feedback and the resistive charging/discharging of the feedback due to parasitic leakage through gates/bulks of different devices of the stacked DPA cell structure. Additionally, and as will be discussed in further detail below, the capacitive divider used in accordance with such topologies suffers from floating gate affects that may create design rules and reliability concerns.

Thus, to address the issues introduced by such single capacitive feedback DPA topologies, the aspects described herein further modify the single capacitive feedback implemented via the DPA cells to incorporate a second feedback mechanism. This dual feedback topology enhances and solves start-up definitions of feedback circuits, and also functions to lower dynamic affects due to dynamic voltage behavior inside the DPA cells. In lowering the dynamic affects, additional advantages may be realized such as a reduction of calibration time and improving key performance indicators (KPI) performance, such as error vector magnitude (EVM) and noise performance, for instance.

Introduction to DPA Architecture

As will be further discussed below, the DPA architecture described herein may form part of an overall digital power amplifier design, which may be used to facilitate the transmission of data for any suitable device in accordance with any suitable type of communication protocol. Such DPA architectures may comprise an array of DPA cells, with each cell independently outputting a digital signal having a particular "swing" or a voltage range that is typically associated with the difference between a digital logic high voltage value and a digital logic low voltage value. The voltage range represents a peak-to-peak voltage amplitude that is proportional to that of one or more received input and/or control signals, and thus the ratio between the peak-to-peak amplitudes of the output and input signal represents the gain or amplification performed by the particular DPA cell, which may alternatively be referred to as a DPA driver cell.

The number of cells in the array may vary based upon the particular power requirements, application, communication protocol, etc., with typical numbers of cells being 64, 128, 256, etc. In any event, each of the cells within the array is digitally-controlled and outputs a signal that is coupled to a suitable digital-to-analog converter component, which then combines and converts each of the digital output signals to create an analog output signal for transmission via an appropriately coupled antenna. Such a digital-to-analog converter component may include known implementations of radio-frequency analog-to-digital converters (RF-DACs) that function to both sum the digital output signals and convert the summed signal to an analog output signal. The output signal thus has an amplitude that is a function of the number of cells in the array that are "on" or actively contributing to the desired analog output. In this way, DPAs function to selectively combine digital signals to achieve a desired output power via the selective combination of appropriate digital signals, thereby accommodating various modulation schemes.

To do so, each cell within the array functions to receive digital data streams such as in-phase digital data and quadrature-phase digital data, and outputs digital signals based upon these received digital data streams. The digital data signals output by each cell within the array thus vary over time as a function of the time-varying characteristics of the analog signal to be transmitted. The DPA architectures as discussed herein are described with respect to a single DPA driver cell in such a configuration of an array of DPA cells. The details and operation of the DPA in accordance with such a cell array architecture is generally known, and thus additional details regarding its operation is omitted for purposes of brevity.

FIG. 1A illustrates a block diagram 100 of conventional DPA driver cell. The DPA driver cell architecture as shown in FIG. 1A may be identified with a single DPA driver cell of a design that includes an array of such cells, as discussed above. As shown in FIG. 1A, a known concept is demonstrated to allow for an increase in the supply voltage of a DPA driver cell up to 2×Vd,max. Again, the parameter Vd,max is defined by a transistor manufacturer and on a per transistor basis. The Vd,max metric defines a maximum operating voltage that may be applied across any two terminals of a transistor without stressing the oxide of the transistor over the long term and resulting in premature failure. For instance, the metric Vd,max may represent the smallest of the various maximum operating voltage ratings for each combination of possible transistor terminals, which may be in the context of a CMOS transistor device in which the gate, drain, and source ports are provided. In such a case, the differential voltages between terminals are defined as Vds, Vgs, and Vgd. Per technology node, there is maximum rating Vd,max of the allowed voltage for these relative port voltages. Thus, as shown in FIG. 1A, the source voltage VDD that is coupled to the upper PMOS transistor is approximately equivalent to twice the Vd,max voltage to facilitate an increase in the peak-to-peak voltage amplitude of the digital signal output by the DPA driver cell 100 and enabling a higher power output by the associated DTX.

In accordance with this conventional configuration, an outer (i.e. upper) PMOS transistor and an outer (i.e. lower) NMOS transistor are each driven by a digital signal having a peak-to-peak amplitude of ~Vd,max. The digital signals as shown in FIG. 1A are provided at the respective gate terminals of each of the output PMOS and NMOS transistors as shown. The outer PMOS transistor is also coupled to a relevant supply voltage (VDD~2×Vd,max) via its source node as shown, and the outer NMOS transistor is also coupled to a common voltage VSS via its drain node as shown. This conventional architecture also includes inner PMOS and NMOS transistors operating in a "common gate" mode in which each gate voltage is set to a DC bias voltage of ~Vd,max. This allows for an output signal to be generated having a voltage swing of 2×Vd,max, which is then provided to the capacitive divider of the array of DPA driver cells to increase the output power. This structure also maintains the stress on the oxides of the transistors at Vd,max to avoid reliability risks.

However, such a configuration limits the output power of the DPA in accordance with the 2×Vd,max swing provided by the output signal. In other words, the DPA cell 100 as shown in FIG. 1A is limited to an amplification of twice that of the voltage swing (or peak-to-peak voltage levels) of the input signals. Therefore, other conventional approaches have been proposed to further increase the output voltage of the DPA driver cells.

Figure 1B:
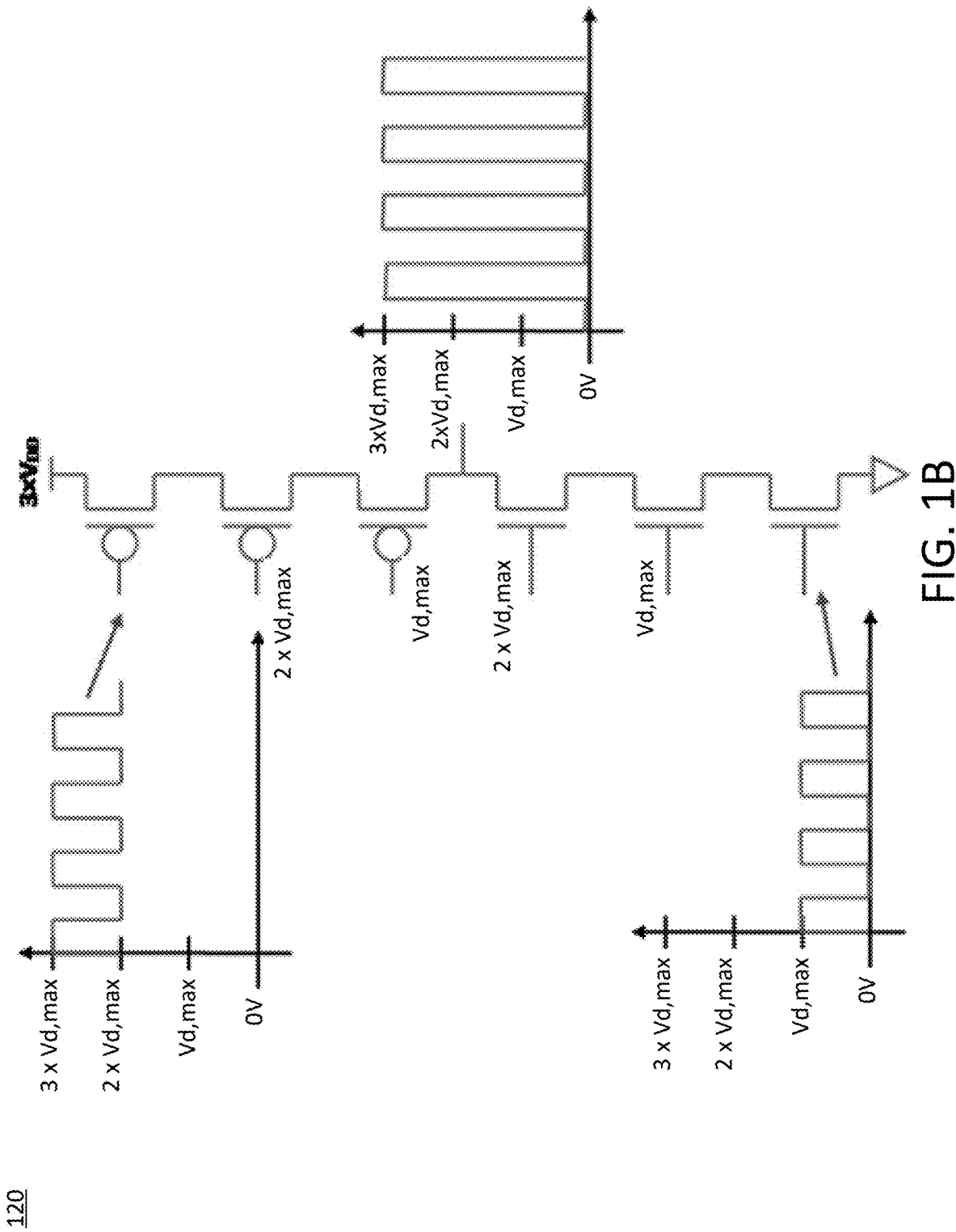
FIG. 1B illustrates an exemplary block diagram of another conventional DPA driver cell.

FIG. 1B illustrates a block diagram of another conventional DPA driver cell. The DPA driver cell architecture shown in FIG. 1B is an extension of the DPA driver cell 100 as shown in FIG. 1A. However, the conventional DPA cell architecture as shown in FIG. 1B uses an additional two transistors to support a supply voltage of Vdd~3×Vd,max, which enables the output signal to have a voltage swing reaching 3×Vd,max. To do so, the DPA driver cell 120 uses DC bias voltages provided to the gates of the inner PMOS and NMOS transistors of 2×Vd,max and Vd,max as shown in FIG. 1B. As a result, and irrespective of what fixed DC bias voltage is used, the inner PMOS and NMOS transistors will suffer from 2×Vd,max stress on their Gate/Drain oxides, thus violating the reliability condition dictated by the Vd,max metric as discussed above. This will lead eventually lead to oxide breakdown and/or a shortened life as a result of punch-through from the excessive Vds voltage during operation.

Figure 1C:
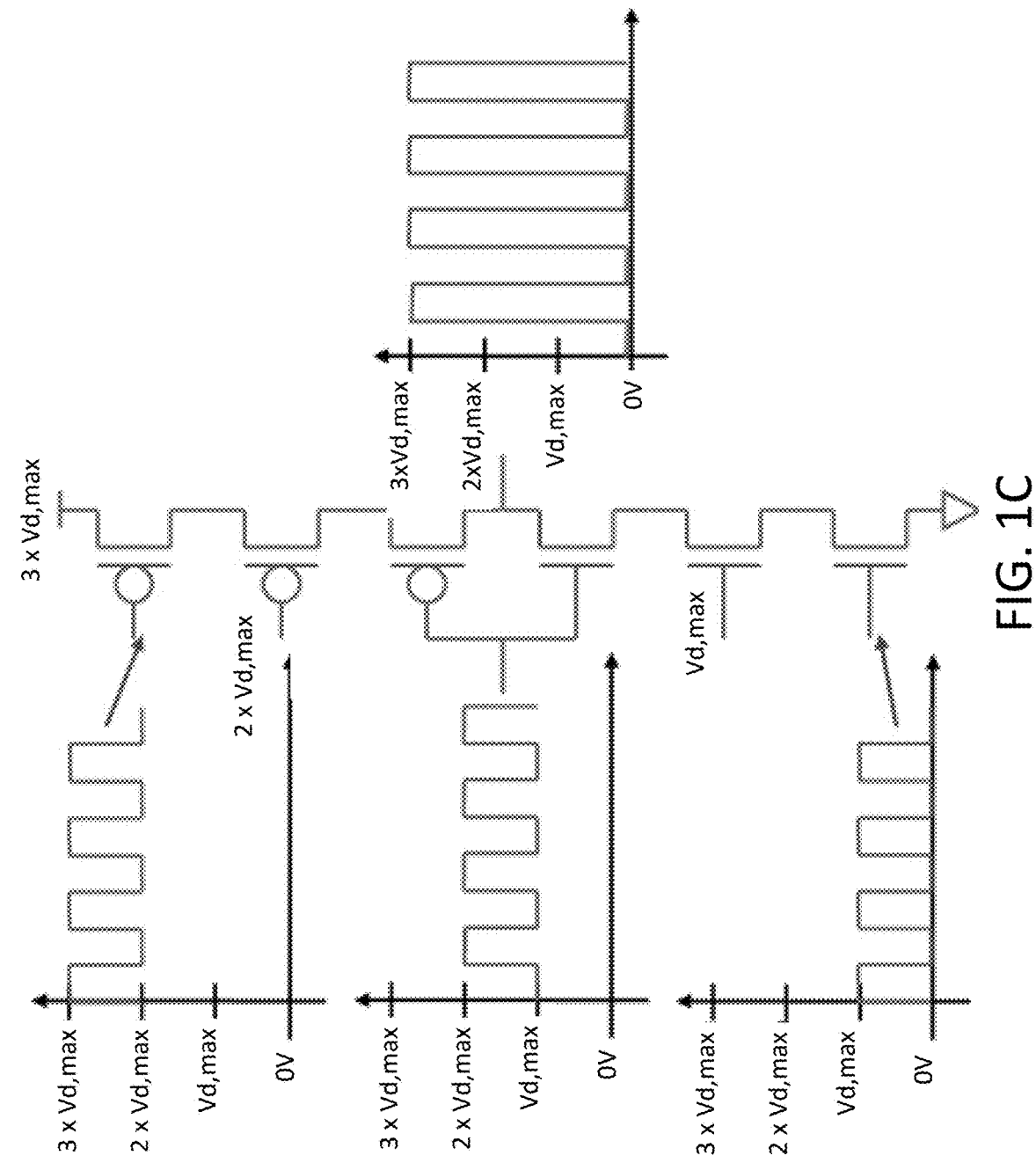
FIG. 1C illustrates an exemplary block diagram of an additional conventional DPA driver cell.

FIG. 1C illustrates a block diagram of another conventional DPA driver cell. The DPA driver cell architecture 140 is similar to the DPA cell architectures as shown in FIGS. 1A and 1B, and attempts to address the above problem of exposing the transistors to excessive voltages. As shown in FIG. 1C, the DPA driver cell 140 drives the outermost PMOS and NMOS transistors with in-phase signals having a voltage swing equal to Vd,max, as was the case in FIGS. 1A and 1B. However, instead of applying a fixed DC bias to each of the inner transistors as shown in FIG. 1B, the DPA driver cell 140 as shown in FIG. 1C uses DC bias voltages of 2×Vd,max and Vd,max at the gates of two of the transistors, whereas the innermost PMOS and NMOS transistors have their coupled gates driven by a third signal having a voltage swing equal to Vd,max but being out of phase with the other two input signals by 180 degrees. This results in the innermost signal being in-phase with the output signal having a voltage swing reaching 3×Vd,max. The phase relationship between the signals reduces the stress on the oxides to the allowed levels.

DPA Cell Architecture

Figure 2A:
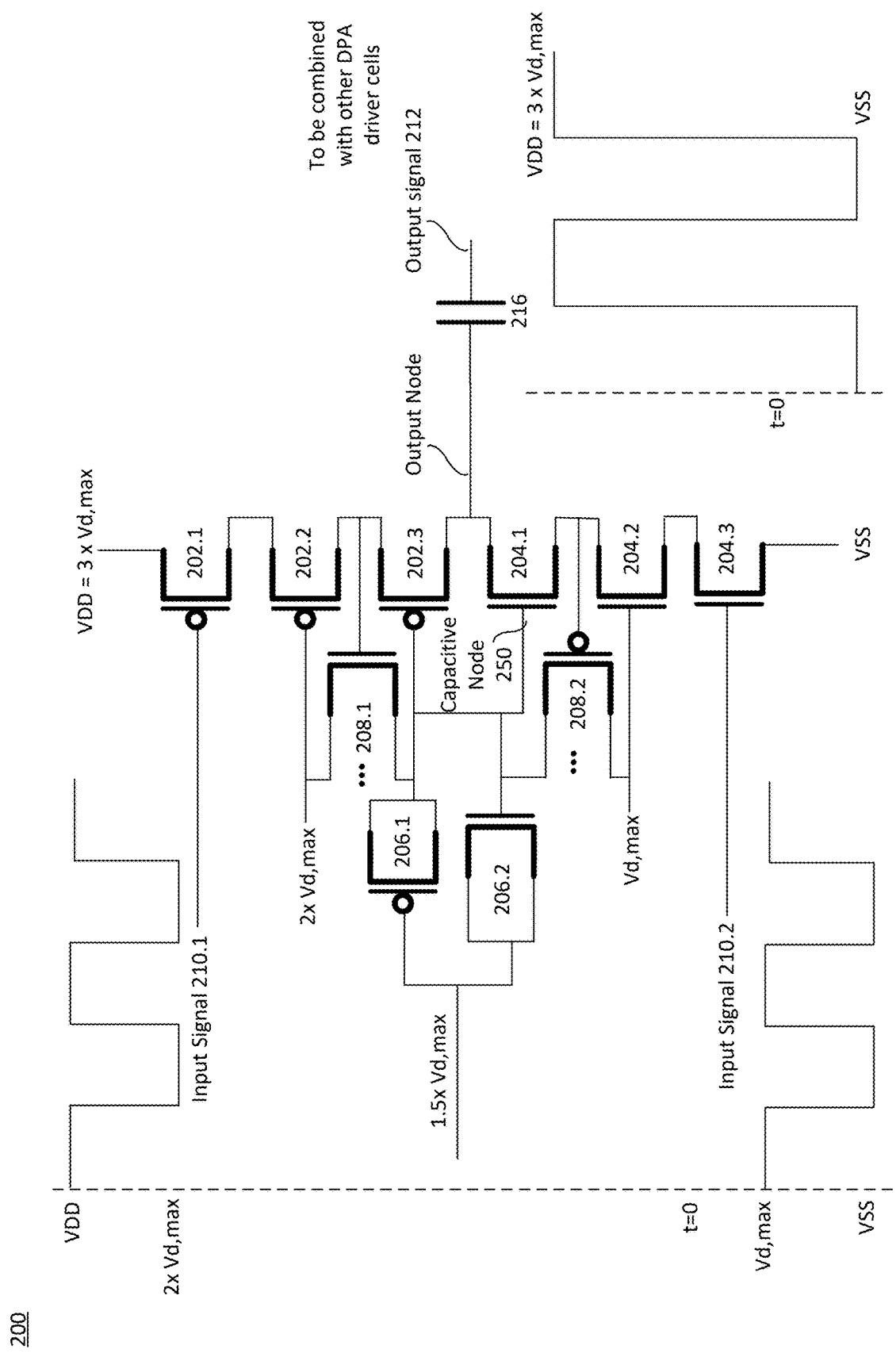
FIG. 2A illustrates an exemplary block diagram of a first DPA driver cell in accordance with the disclosure.

FIG. 2A illustrates a block diagram of a DPA driver cell, in accordance with the disclosure. As shown in FIG. 2A, the DPA driver cell 200 may form part of a digital power amplifier circuit, which includes a set or plurality of PMOS transistors 202.1-202.3, a set or plurality of NMOS transistors 204.1-204.3, a set or plurality of transistors 206.1-206.2, and a set or plurality of transistors 208.1-208.2. The number of transistors and their connections to one another are shown in FIG. 2A in a non-limiting manner, and other configurations, types of transistors, and number of transistors may be implemented to realize the DPA driver cell 200, which may form one of several driver cells or buffers/inverters in an array of similar or identical cells that are implemented by a DTX architecture as noted above. The various transistors as discussed herein with respect to the DPA driver cells, pre-driver cells, level shifting circuits, etc., may be implemented in accordance with any suitable type of transistors, such as field-effect transistors or other suitable transistors depending upon the required speed, power handling, etc., for the particular application.

As shown in FIG. 2A, the DPA driver cell 200 includes three PMOS transistors 202.1-202.3, three NMOS transistors 204.1-204.3, two transistors including a PMOS transistor 206.1 and an NMOS transistor 206.2, and two transistors including an NMOS transistor 208.1 and a PMOS transistors 208.2. The various transistors 202, 204, 206, 208 may be implemented as any suitable type of transistor configured to provide voltage switching in accordance with any suitable type of data communication protocol, and may operate in accordance with any suitable switching speeds. The various transistors of the DPA driver cell 200 have a maximum operating voltage specification of Vd,max, which is identified with a maximum voltage across any two terminals of each transistor as noted above. In the configuration as shown in FIG. 2A, the DPA driver cell 200 is driven with two in-phase input signals 210.1, 210.2, each having a voltage swing or peak-to-peak voltage equal to or approximately equal to (within 1%, 2%, 5%, 10%, etc.) the Vd,max voltage value. The input signals 210.1, 210.2 are coupled to a respective gate of the PMOS transistor 202.1 and NMOS transistor 204.3, with each signal 210.1, 201.2 having a respective voltage range that varies between an upper voltage level (VDD or 3×Vd,max for input signal 210.1 and Vd,max for input signal 210.2) and a lower voltage level (2×Vd,max for input signal 210.1 and VSS for input signal 210.2). Thus, the input signals 210.1, 210.2 may be considered one or more of time-varying digital signals, time-varying analog signals, and/or time-varying control signals, depending upon the particular application, which in any case vary between a particular high voltage level (which may be a logic high voltage level or other suitable reference voltage) and a particular low voltage level (which may be a logic low voltage level or other suitable reference voltage).

However, unlike the conventional implementations of the DPA driver cells as shown in FIGS. 1A-1C, the DPA driver cell 200 does not require additional DC-DC voltage sources to provide the DC bias voltages at the gates of the transistors 202.2 and 204.2. Instead, and as further discussed herein, each of the transistors 202.2 and 204.2 has a floating gate configuration in which the respective gate of each transistor is not coupled to a DC-DC voltage source but instead develops or self-generates a DC bias voltage (i.e. 2×Vd,max and Vd,max) as a result of the circuit configuration as shown in FIG. 2A. Furthermore, the gate of each of the PMOS transistor 202.3 and the NMOS transistor 204.1 are coupled to one another and also have a floating gate configuration, i.e. the gates are not actively driven by a signal or DC-DC voltage source. The source or drain terminals of the PMOS transistor 202.3 and the NMOS transistor 204.1 are also coupled to one another via respective output node terminals (which may be drain or source terminals) to form an output node as shown in FIG. 2A, which is coupled in turn to the capacitor 216 identified with the output signal 212. This configuration advantageously enables the transistors 202.3, 204.1 to generate the output signal 212 in a manner such that the voltage at the gate terminals tracks the voltage of the output signal 212, which is 180 degrees output of phase with the input signals 210.1, 210.2, thereby reducing stress on the oxides.

Moreover, this configuration enables the DPA driver cell 200 to utilize a single DC-DC converter or voltage source to supply VDD for the PMOS transistor 202.1 and VSS for the NMOS transistor 204.3. In other words, this enables the DPA driver cell 200 to implement only a single DC-DC converter to supply the voltage sources VDD and VSS. This is a distinct advantage over the conventional implementations of the DPA driver cells as shown in FIGS. 1A-1C, which require separate DC-DC converters to supply the DC bias voltages, as the DC bias voltages are not self-generating in those configurations as the gates of the transistors for the conventional DPA driver cells 100, 120, and 140 are not floating.

The DPA driver cell 200 self-generates the DC bias voltages as a result of a feedback capacitive ratio formed via the coupling of the transistors 206.1, 206.2 to the floating gate connection of the transistors 202.3, 204.1. That is, the DPA driver cell as shown in FIG. 2A implements a feedback capacitive ratio that is generated between the gate-drain capacitance of the PMOS transistor 202.3 and the NMOS transistor 204.1, i.e. between the output node of the transistors 202.3, 204.1 and the Vd,max/2 biased transistors 206.1, 206.2 (which may be the same size as one another but larger than the transistors 202.3, 204.1 to achieve this larger capacitance). The capacitive ratio is thus formed via the 2× capacitance due to the gate-source and gate-drain capacitances of the transistors 206.1, 206.2.

Figure 2B:
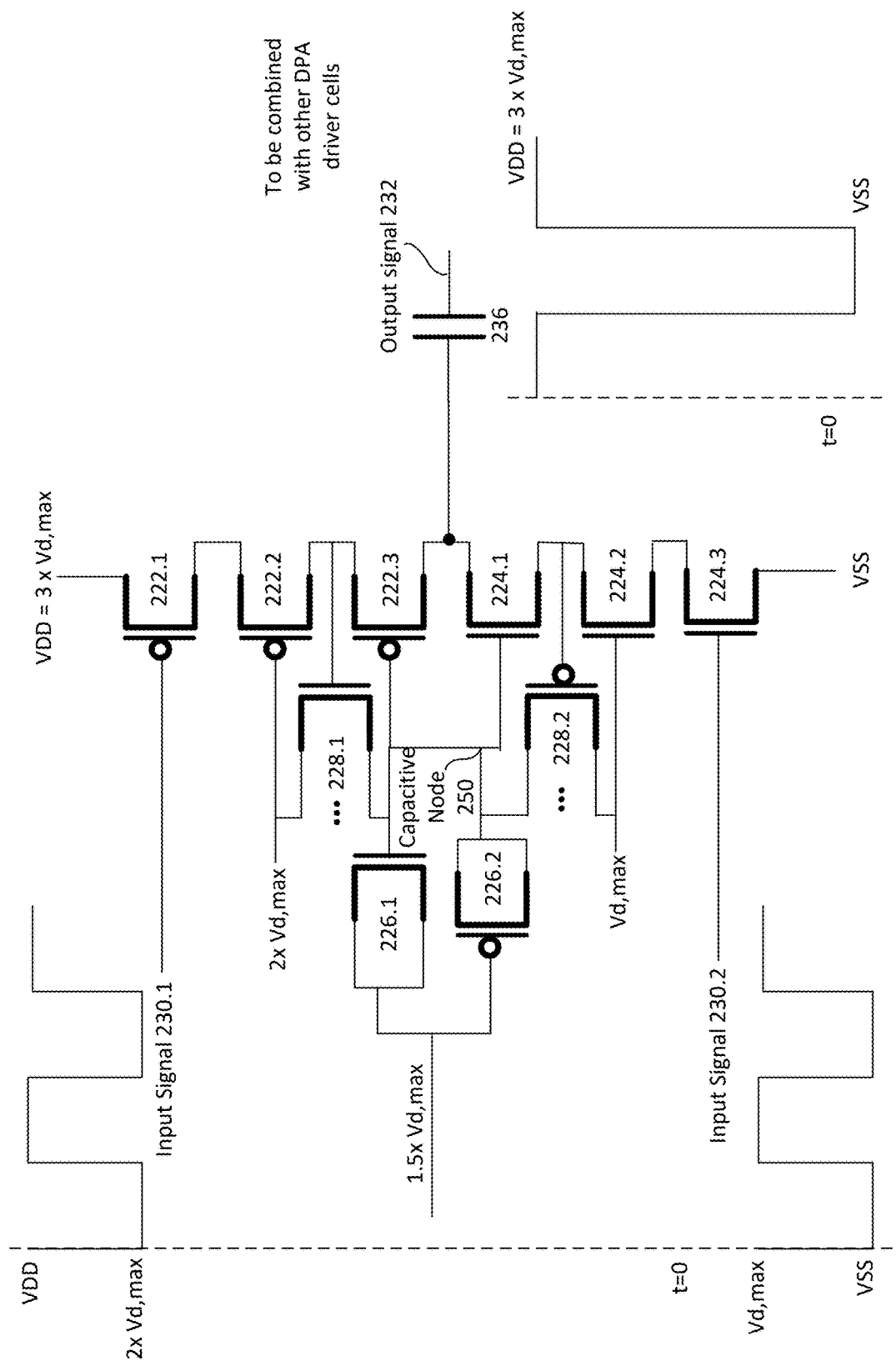
FIG. 2B illustrates an exemplary block diagram of a second DPA driver cell in accordance with the disclosure.

The DPA driver cell 200 is shown in FIG. 2A as a part of a single-ended DTX implementation. However, the DPA driver cell 200 may additionally or alternatively be implemented as part of a differential signal DTX architecture. In accordance with such implementations, the DPA driver cell 200 may be referred to as a P-channel DPA driver cell, and work in conjunction with an N-channel DPA driver cell, which is illustrated in FIG. 2B. Of course, the DPA driver cell 220 as shown in FIG. 2B may alternatively be implemented as part of a single-ended signal DTX design.

In any event, the DPA driver cell 220 functions in a similar manner as the DPA driver cell 200, and common elements between the two are omitted for brevity. The DPA driver cells 200, 220 may have an identical architecture and configuration as one another, but receive input signals 210.1, 210.2 and 230.1, 230.2 having 180 degree phase shifts as shown in FIGS. 2A-2B, thus generating output signals 212, 232 having 180 degree phase shifts with respect to one another. That is, when used as part of a differential signal DTX implementation, the P-channel DPA driver cell 200 and the N-channel DPA driver cell 220 may be driven with input signals having a 180 phase difference between one another, resulting in the output signals 212, 232 likewise having a 180 degree phase offset between one another, with each of the DPA driver cells 200, 220 generating respective output signals 212, 232 that represent a 180 degree phase shift from their respective input signals 210.1, 210.2 and 230.1, 230.2. Each of the output signals 212, 232 for the DPA driver cells 200, 220 is further coupled to a capacitor 216, 236 as shown in FIGS. 2A-2B, which represents a multiplicative capacitor that is present on the output of each DPA driver cell 200, 220 within the array as discussed above.

Figure 2C:
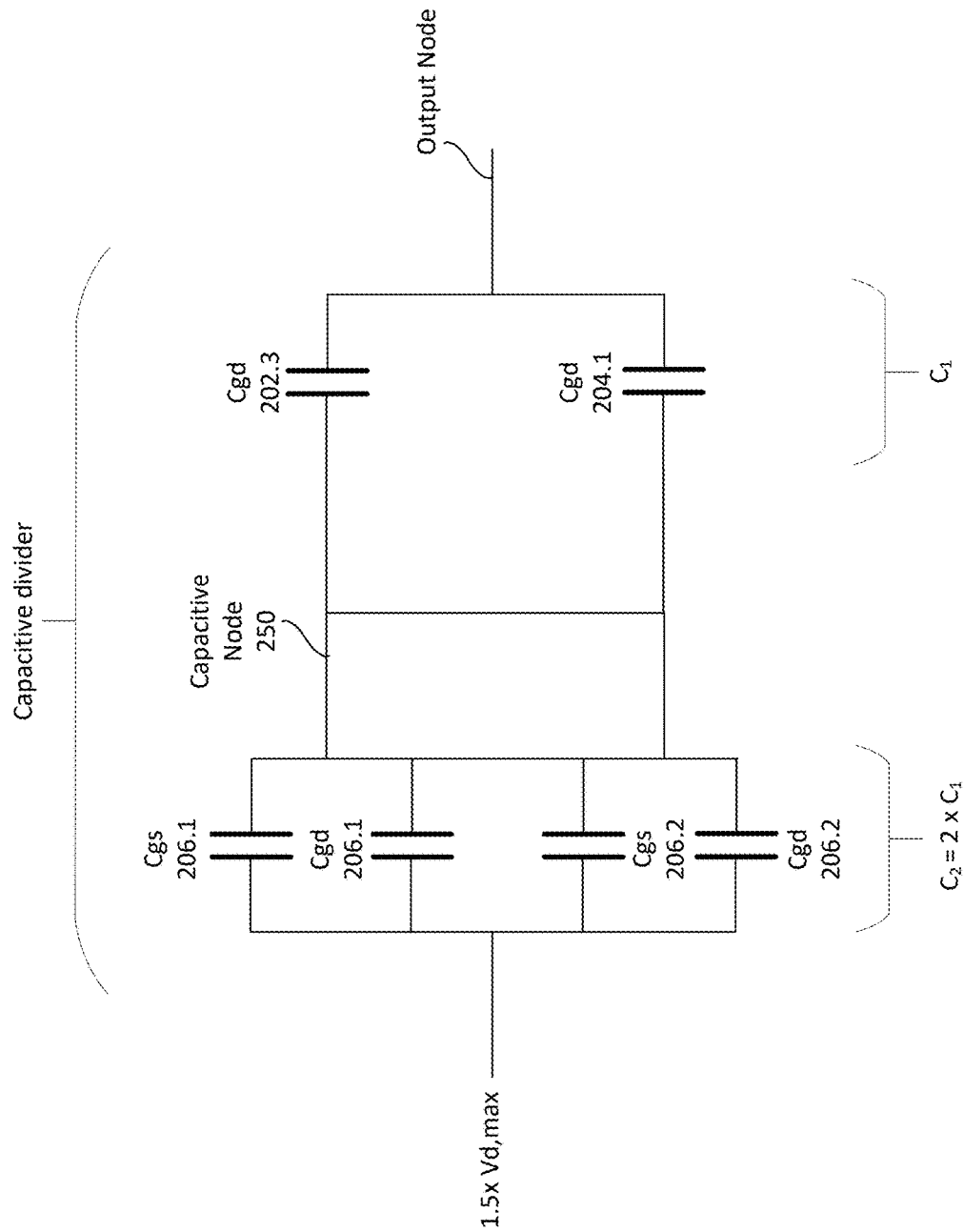
FIG. 2C illustrates an exemplary block diagram of a capacitive divider associated with the first feedback path of the DPA driver cell as shown in FIG. 2A, in accordance with the disclosure.

FIG. 2C illustrates a block diagram of a capacitive divider associated with either of the DPA driver cells 200, 220 as shown in FIGS. 2A and 2B, respectively, which provide the capacitive feedback ratio for each respective DPA cell. The capacitive divider 240 is shown in FIG. 2C with reference to the components of the DPA cell 200 as shown in FIG. 2A, although the illustration applies equally to the DPA driver cell 220 and to the analogous transistors of the DPA driver cell 220. The transistors 206.1-206.2 may be substantially the same as one another (the same manufacturer, part number, type, size, etc.) and thus have substantially the same intrinsic capacitance values (within some manufacturing tolerances such as 1%, 2%, 5%, etc.). As a result, the transistors 206.1, 206.2 each have an equal intrinsic gate-source (Cgs) and gate-drain (Cgd) capacitance formed between their respective terminals as a result of the layout of these components (with Cgs and Cgd also being equal to one another). This is true for each of the transistors 206.1, 206.2. Thus, the transistors 206.1, 206.2 need not be connected in the configuration as shown in FIG. 2A to provide the same capacitive ratio, and may alternatively be coupled in a different arrangement in which the gate terminals of each of the transistors 206.1, 206.2, 202.3, and 204.1 are coupled to one another (i.e. switching the connections for transistor 206.1). Furthermore, each of the transistors 202.1-202.3 and 204.1-204.3 may be substantially the same as one another (the same manufacturer, part number, type, size, etc.) and thus have substantially the same intrinsic capacitance values (within some manufacturing tolerances such as 1%, 2%, 5%, etc.). As a result, the transistors 202.3, 204.1 each have equal intrinsic gate-drain capacitances (and gate-source capacitances, which are also equal to their gate-drain capacitances).

Figure 3:
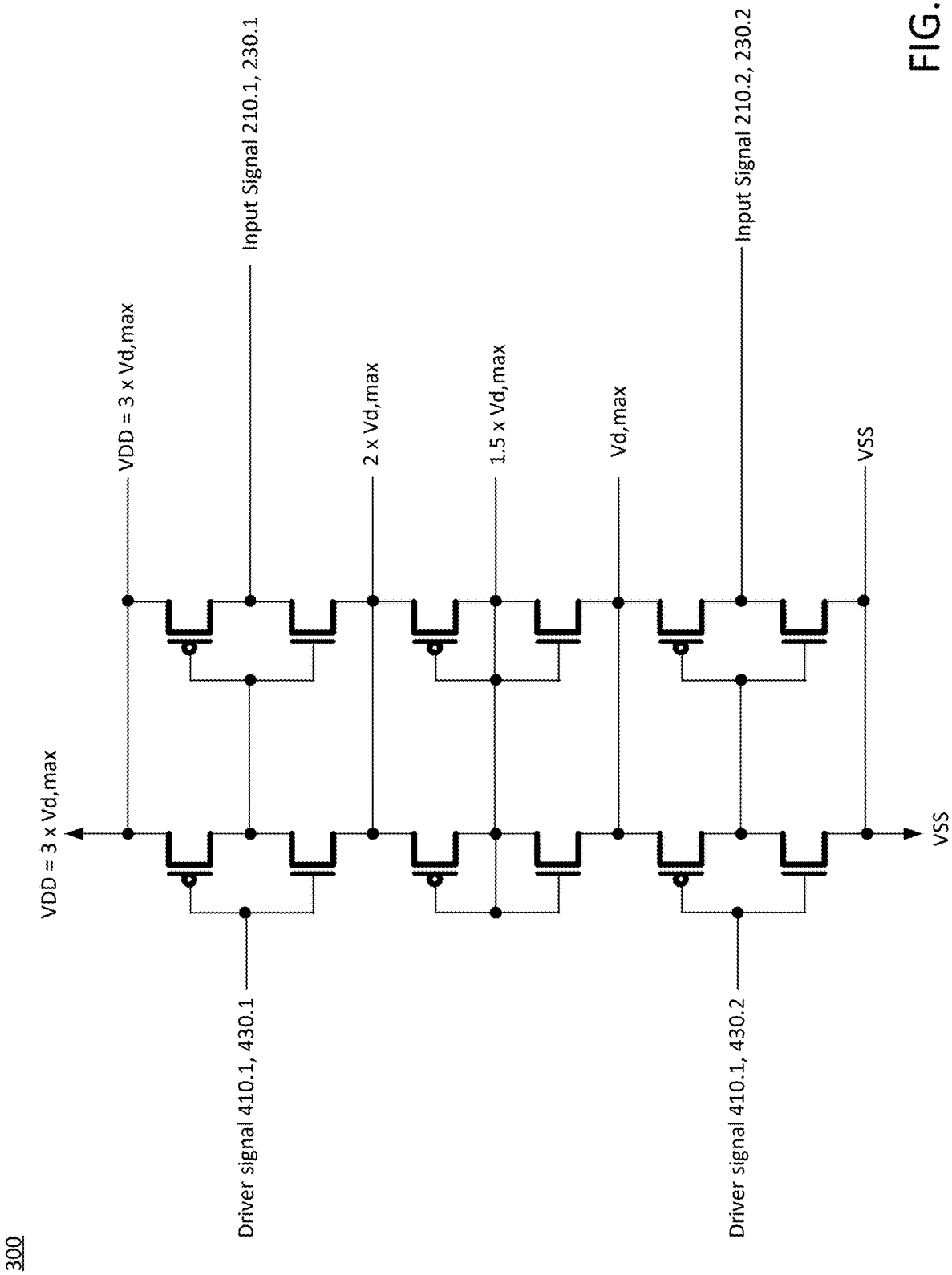
FIG. 3 illustrates an exemplary DPA pre-driver cell in accordance with the disclosure.

The DPA driver cells 200, 220 may thus implement any suitable number of transistors 202, 204, 206, and 208 (and 222, 224, 226, and 228 as applicable) such that a desired capacitive feedback ratio is achieved. For the DPA driver cell 200 configuration as shown in FIG. 2A, the capacitive ratio is 2:1 as a result of the transistors 206.1, 206.2 having a capacitance of $C_2=4\times Cgd$ (assuming Cgs and Cgd are equal), whereas the transistors 202.3, 204.1 have a capacitance of $C_1=2\times Cgd$. In other words, the capacitive feedback ratio is such that $C_1=2C_2$. In accordance with such a configuration, a capacitive divider as shown in FIG. 2C is formed between the transistors 206.1, 206.2 and the transistors 202.3, 204.1 to define the feedback capacitive ratio of 2:1. This capacitive feedback ratio also enables the self-generation of the DC bias voltage that is half of the maximum voltage Vd, max (⅓ of VDD) as shown in FIG. 3 (1.5×Vd,max) as a result of the capacitive coupling between the input and output of the DPA driver cell 200. This enables AC feedback for the DPA driver cells 200, 220 via this coupled capacitive feedback path, which may be alternatively referred to herein as a first feedback path or a first capacitive feedback path. The capacitive feedback ratio may be set by selecting the appropriate number, type, and/or size of transistors 202, 204, 206 (or analogous transistors 222, 224, 226 for the DPA driver cell 220). The transistors 206.1, 206.2 may be selected to be a larger size such that their intrinsic capacitance values are larger than that of the transistors 202, 204, or may be identical to the transistors 202, 204 but be greater in number to stack their capacitances as desired.

As a result of the feedback capacitive ratio, the DPA driver cells 200, 220 also achieve the desired amplification of the input voltage signals 210.1, 210.2 or 230.1, 230.2, as the case may be. That is, and using the DPA driver cell 200 in this scenario for illustrative purposes, the DPA driver cell 200 generates an output signal 212 in accordance with the feedback capacitive ratio such that the output signal 212 has a voltage swing or range that varies between the upper voltage level of the input signal 210.1 (VDD) and the lower voltage level of the input signal 210.2 (VSS). Thus, as a result of the floating gate configuration of the transistors 202.3, 204.1, the gates of the transistors 202.3, 204.1 track the output signal 212. This eliminates stress on each of the transistors in the DPA driver cells 200, 220, as no transistor in the DPA driver cell 200, 220 develops a voltage across any two respective terminals that exceeds the peak-to-peak amplitude (i.e. swing or voltage range) of the input signals 210.1, 210.2 (or 230.1, 230.2) which is Vd,max as shown in FIG. 2A.

Figure 2D:
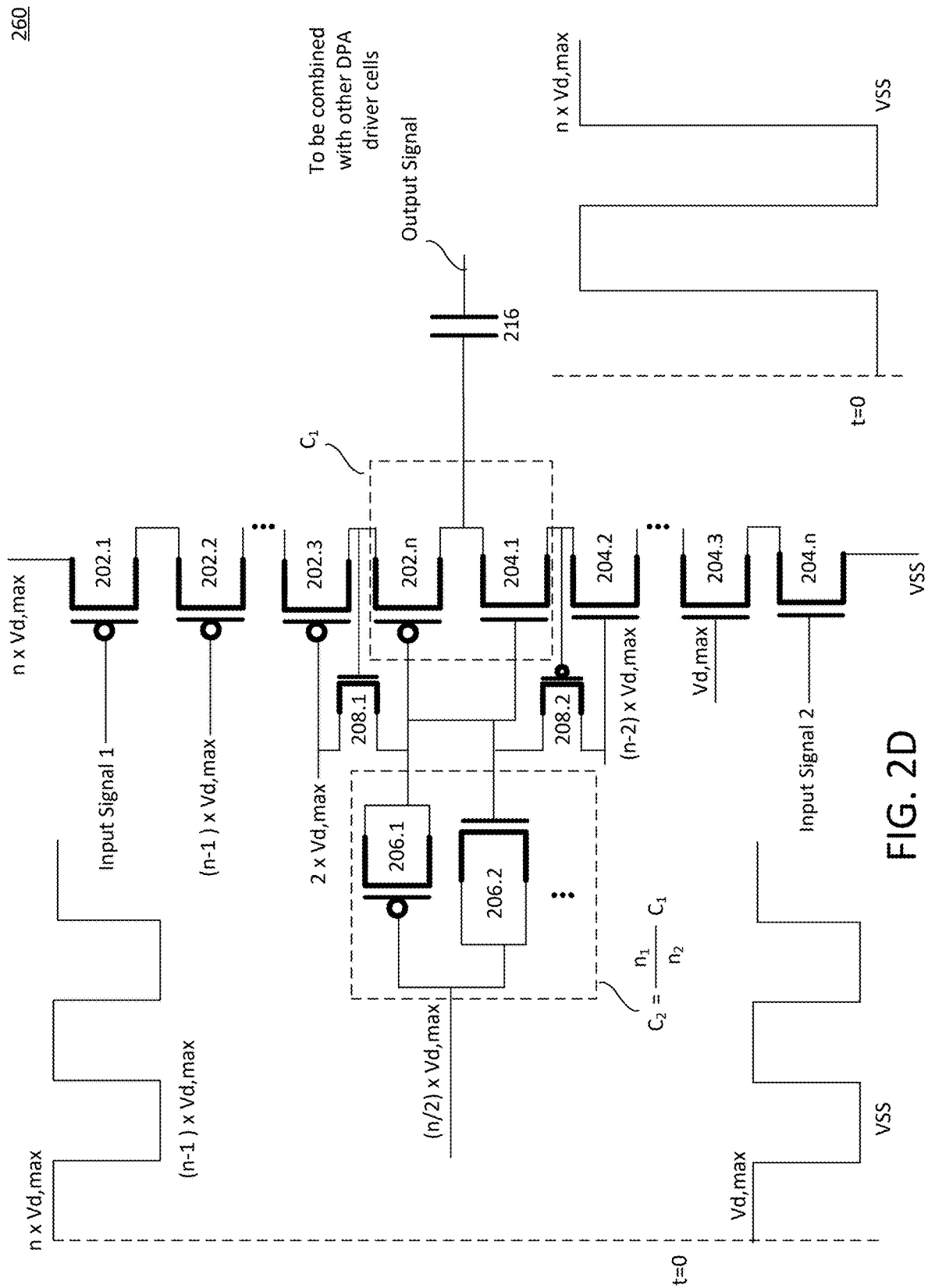
FIG. 2D illustrates an exemplary block diagram of an extension of the DPA driver cell as shown in FIG. 2A, in accordance with the disclosure.

FIG. 2D illustrates a block diagram of a DPA driver cell associated with a digital power amplifier (DPA) architecture, in accordance with the disclosure. The DPA driver cell 260 as shown in FIG. 2D includes similar components as shown and discussed above with reference to the DPA driver cells 200, 220 as shown in FIGS. 2A and 2B. The DPA driver cell 260 illustrated in FIG. 2D is an extension of the DPA driver cell 200 as shown in FIG. 2A, although the concepts discussed herein with respect to the extension of the DPA cell 200 is equally applicable to the extension of the DPA cell 220. Common and analogous elements between the DPA driver cells 200, 220 and the DPA driver cell 260 are not described further for purposes of brevity.

The DPA driver cell 260 illustrates an extension of the DPA driver cell 200 and how a DPA driver cell may be implemented generally with any suitable number of transistors to facilitate receiving two in-phase input signals having a voltage range or swing (i.e. peak-to-peak amplitudes) of Vd,max (or other suitable voltage ranges). The DPA driver cell 260 also facilitates any suitable level of amplification as a function of the number n of PMOS and NMOS transistors 202, 204, respectively. For instance, the output signal as shown in FIG. 2D provides a peak-to-peak amplitude that is a multiple 'n' of the peak-to-peak amplitude of the two input signals.

Again, 'n' as shown in FIG. 2D is equal to the number of the PMOS transistors 202.1-202.n, which is equal to the number of NMOS transistors 204.1-204.n. In this configuration, the number and type of transistors 206.1, 206.2 may be selected having any suitable intrinsic gate-source and gate-drain capacitances to provide a desired capacitive feedback ratio for the capacitive divider. As shown in FIG. 2D, which is a non-limiting illustration, it is assumed that the capacitive divider is set such that $$C_1 = \frac{n_1}{n_2} C_2,$$

or alternatively expressed to match the relationship in FIG. 2C as $$C_2 = \frac{n_2}{n_1} C_1$$

to allow the appropriate feedback that protects the transistor's oxide stress below Vd,max. In this representation of the desired capacitive feedback ratio for the capacitive divider, the ratio of sizing $n_1/n_2$ between the transistors 206.1, 206.2 and the transistors 202.n, 204.1 ensures the proper capacitive divider feedback of the output voltage to maintain the transistors free from stress. This is a design choice and can be tuned during the design procedure to ensure long term reliability and performance. The self-generating DC bias voltage at the gate of the transistor 206.1 and the drain-source terminals of the transistor 206.2 is generally represented in FIG. 2D as half the number n of the PMOS transistors 202.1-202.n, which is equal to the number of NMOS transistors 204.1-204.n, and thus is equal to a proportion of (n/2) of the supply voltage VDD. Extending this generality, the generated output signal would have a voltage swing or peak-to-peak amplitude of n×Vd,max. Such implementations are mainly limited by avalanche breakdown of the particular transistors that are used.

Voltage Stabilizing Feedback Path

Referring back to FIGS. 2A-2B, the first capacitive feedback path is formed via the equivalent capacitive elements identified with these transistors as shown in FIG. 2C. Thus, and with reference to FIGS. 2A-2B, the first capacitive feedback path may be represented as the capacitive coupling formed via the transistors 206.1, 206.2 and the transistors 202.3, 204.1, or analogously the transistors 226.1, 226.2, 222.3, 224.1 as shown in FIG. 2B. As a result of this first capacitive feedback path, a capacitive node 250 is illustrated in FIG. 2C as the coupling between $C_1$ and $C_2$ that forms the capacitive divider as noted above. This capacitive node 250 corresponds to the node formed by the connections to the gates of the transistors 202.3, 204.1 as shown in FIG. 2A or, alternatively, the connections to the gates of the transistors 222.3, 224.1 as shown in FIG. 2B. The floating gate configuration of the transistors 202.3, 204.1 and 223.3, 224.1, respectively, enables the gates of the transistors 202.3, 204.1, 223.3, and 224.1 to track the respective output signal 212, 232. This floating gate configuration eliminates stress on each of the transistors in the DPA driver cells 200, 220.

However, this floating gate configuration may create reliability concerns, as the voltage at the floating gates is not well defined during start up periods or when the DPA driver cell 200, 220 is not active (i.e. off) which may result in dynamic affects due to dynamic voltage behavior inside the DPA cells. In particular, when only the single capacitive feedback path is present, there is no well-defined voltage at this capacitive node 250, particularly during startup and during off time periods, due to a lack of a defined DC path. This also presents issues related to residual charge that may be left on the capacitors of the capacitive divider as shown in FIG. 2C during manufacturing processes, which are unpredictable and thus difficult to account for during operation.

Thus, the implementation of an additional capacitive feedback path is described in further detail herein, which may be referred to as a second feedback path or a voltage stabilizing feedback path. The voltage stabilizing feedback path is formed via the second set or plurality of transistors 208.1, 208.2 as shown in FIG. 2A and their respective connections, and the second set or plurality of transistors 228.1, 228.2 as shown in FIG. 2B and their respective connections. The voltage stabilizing feedback path may thus be formed from the source-drain connections of the respectively coupled transistors 202.2, 202.3, 204.1, 204.2 and the drain-source connections of the transistors 208.1, 208.2 to the capacitive node 250 and to each self-generated DC bias 2×Vd,max, Vd,max, respectively, as shown in FIG. 2A. With respect to FIG. 2B, the voltage stabilizing feedback path is formed from the source-drain connections of the respectively coupled transistors 222.2, 222.3, 224.1, 224.2. and the drain-source connections of the transistors 228.1, 228.2 to the capacitive node 250 and to each self-generated DC bias 2×Vd,max, Vd,max, respectively.

In other words, the voltage stabilizing feedback path includes one or more transistors 208.1, 228.1 having their respective source-drain terminals coupled between the self-generated DC bias voltage 2×Vd,max and the floating gate of the transistor 202.3, 222.3 (as the case may be with respect to FIGS. 2A and 2B). Moreover, the voltage stabilizing feedback path includes one or more transistors 208.2, 228.2 having their respective source-drain terminals coupled between the self-generated DC bias voltage Vd,max and the floating gate of the transistor 204.1, 224.1 (as the case may be with respect to FIGS. 2A and 2B). The transistors 208.1, 208.2, 228.1, 228.2 thus function as switches, each selectively coupling the self-generated DC bias voltages 2×Vd, max, Vd,max to a respective capacitor node formed at the gate of each of the transistors 202.3, 204.1, 222.3, 224.1. In doing so, the voltage at the capacitive node 250 is stabilized or "clamped" within a voltage between 2×Vd,max or Vd,max depending upon which of the transistors 208.1, 208.2, 228.1, 228.2 is placed into a conductive state, despite the floating gate topology as noted above.

Thus, regardless of the overall state of the DPA cells 200, 220, the voltage stabilizing feedback path ensures that the voltage at the capacitive node 250 is well-defined. In particular, the additional voltage stabilizing feedback path functions to allow the conditions of all the stacked gates in the DPA cell 200, 220 to be well defined during off time periods and during transient time periods shortly after an off state, which may include providing a well-defined DC voltage (such as 2×Vd,max, Vd,max, or a range between) on the capacitive node 250 as noted above. This is a result of the transistors 222.2, 222.3, 224.1, 224.2 functioning as fast DC switches that enable tracking of the input signals 210.1, 210.2, 230.1, 230.2 in parallel with the aforementioned first capacitive feedback path. In this way, the first capacitive feedback path and the voltage stabilizing feedback path work together to define the voltages at the inner gates (i.e. the gates of the transistors 202.2, 202.3, 204.1, 204.2 for FIG. 2A, and transistors 222.2, 222.3, 224.1, 224.2) of the DPA driver cells 200, 220, during operation-even when the DPA driver cells are off during the transient startup time after a DPA driver cell off state.

The implementation of the voltage stabilizing feedback in this manner results in low distortion gate biases and ultra-fast and stable switching of the DPA driver cells 200, 220, which results in better dynamic and static performance. This is illustrated in further detail below with reference to the FIGS. 6A-6B, 7, 8A-8C, and 9. This dual feedback topology also reduces the voltage fluctuations on the transistor gates of the DPA driver cells 200, 220, especially during ON/OFF transitions, resulting in lower dynamic effects on the input signal 210.1, 210.2, 230.1, 230.2. Thus, the dual feedback path topology as discussed herein enables a proper biasing during start-up and working stages of DPA architectures that implement the DPA driver cells 200, 220. In other words, the second voltage stabilizing feedback path allows for a more accurate tracking of the capacitor feedback formed by the capacitive divider, as the first capacitive feedback alone only provides parasitic capacitive feedback.

As will be further discussed below, although the voltage stabilizing feedback as shown in FIGS. 2A and 2B includes two transistors, this is a non-limiting scenario. The number and/or size of the transistors 208.1, 208.2, 228.1, 228.2, etc. in the voltage stabilizing feedback path may be varied in accordance with any suitable application to achieve additional fine tuning of the capacitive divider voltages.

Optional Pre-Driver Cell

FIG. 3 illustrates a DPA pre-driver cell, in accordance with the disclosure. The DPA pre-driver cell 300 as shown in FIG. 3 is an optional component that may be implemented to generate the bias voltages used by the DPA driver cell architecture as discussed herein with reference to FIGS. 2A-2D. As shown in FIG. 3, the DPA pre-driver cell 300 functions as a buffer circuit for the input signals 210.1, 210.2 or 230.1, 230.2, as the case may be, which are generated using the driver signals 410.1, 410.2, 430.1, 430.2, which may be provided by a level-shifting circuit or other suitable DPA driving circuit, as further discussed below. The use of the DPA pre-driver cell 300 mainly depends on the sizing of the output stage of the DPA driver cell 200, 220 and a tradeoff between a desired reduction in the amount of components and die space for a particular DPA design. That is, some implementations may include a DPA driver cell 200, 220 having an output stage(s) small enough to be driven directly by a DPA driving circuit such as a level shifter. For larger sized output stages, it may be desirable to add the optional DPA pre-driver cell for stability and to ensure adequate current sourcing is achieved.

Although the DPA pre-driver cell 300 may be used to generate the bias voltages as shown in FIG. 3, which may then be coupled to the DPA driver cell 200, 220, this may still be achieved via a single DC-DC converter or other suitable power supply. That is, using the illustrated pre-driver cell 300 as shown in FIG. 3, a DC-DC converter may function to provide the voltages VDD and VSS. Like several of the gates of the transistors of the DPA driver cell 200, 220, the middle four transistors as shown in FIG. 3, which are implemented by the pre-driver cell 300, are not actively driven by the driver signals 410.1, 410.2, 430.1, 430.2, and thus are likewise floating. Thus, the remaining bias voltages 2×Vd,max, 1.5×Vd,max, and Vd,max are self-generated bias voltages that result from the stacked architecture of the pre-driver cell 300 or, when not used, the stacked architecture of the DPA driver cell 200, 220 as noted above.

Therefore, the need for additional DC-DC converters or other voltage supplies is obviated and the self-generated bias voltages may be generated by leveraging the floating gate architecture of the transistors of the pre-driver cell 300 and/or the DPA driver cell 200, 220 as applicable. Moreover, due to the floating gate architecture of the DPA driver cell 200, 220 as discussed herein, the self-generated DC bias voltages (regardless of whether these are generated via the pre-driver cell 300 or the DPA driver cell 200, 220), are sufficient to provide the output signal with the desired voltage range due to the low current requirements enabled by the floating transistor gates.

Level Shifting Circuit with Dual Feedback Paths

Figure 4:
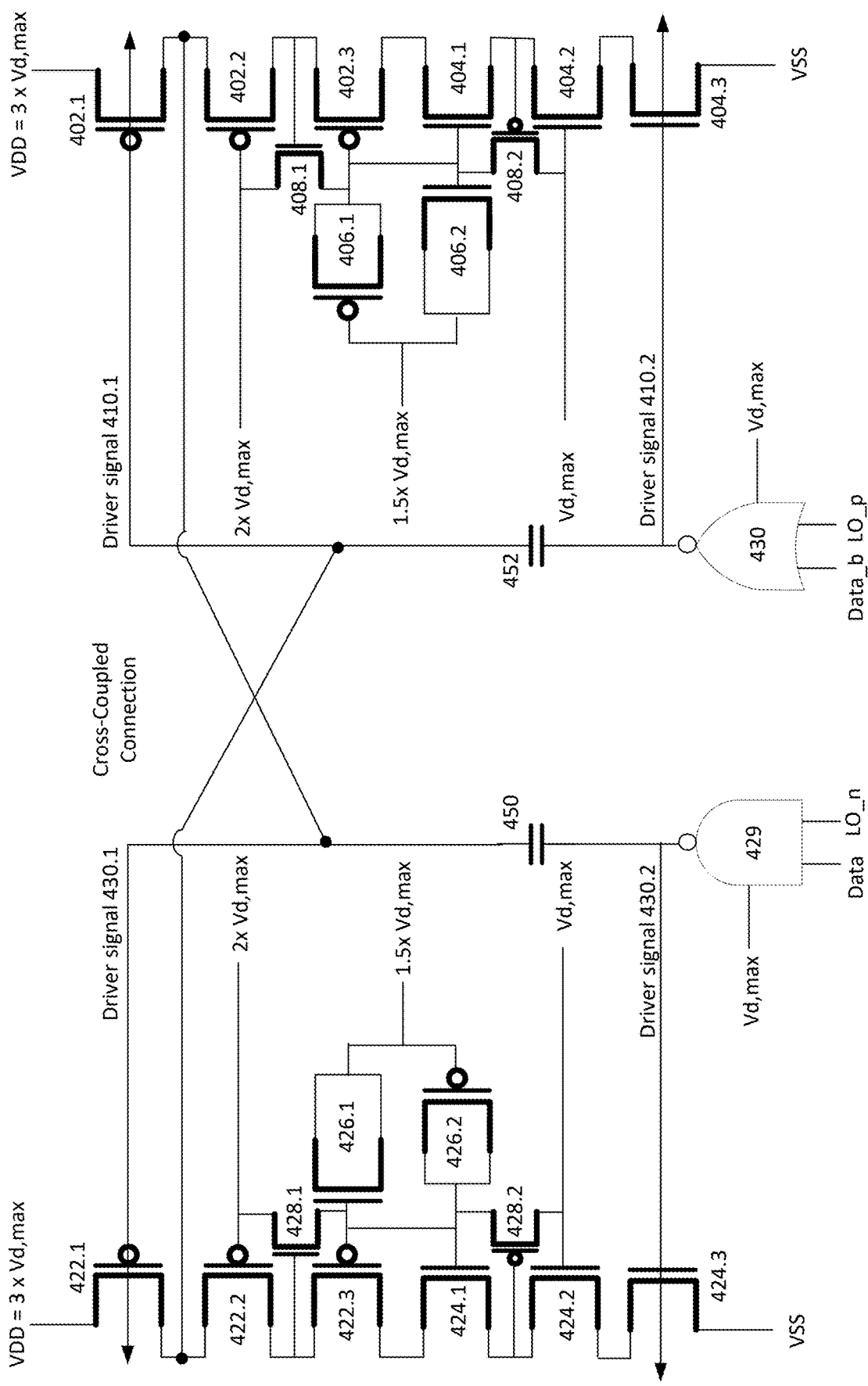
FIG. 4 illustrates an exemplary DPA level shifting circuit in accordance with the disclosure.

FIG. 4 illustrates a DPA level shifting circuit, in accordance with the disclosure. The level shifting circuit 400 generates a set of driver signals 410.1, 410.2, 430.1, 430.2 as discussed above with reference to FIG. 3, which provide level-shifted versions of the received data signals. The DPA level shifting circuit 400 may include two different sets of transistors, each having the same configuration as the transistors discussed herein with reference to the DPA driver cells 200, 220. That is, the set of driver signals 410.1, 410.2, 430.1, 430.2 are shown in FIG. 4 with respect to a differential signal DTX implementation, with each half of the level shifting circuit 400 supplying driver signals to a different DPA cell associated with each respective half of the differential signal architecture. The right side of the DPA level shifting circuit 400 as shown in FIG. 4 may have a configuration of transistors identical to or substantially similar to those associated with the DPA driver cell 200, which may be referred to as a p-channel driver cell 200 in this scenario. Thus, the right side of the DPA level shifting circuit 400 includes a first capacitive feedback path comprising the capacitive voltage divider formed by the transistors 406.1, 406.2, 402.3, 404.1. The right side of the DPA level shifting circuit 400 also includes a second or voltage stabilizing feedback path comprising the transistors 408.1, 408.2 and the source-drain connections of the respectively coupled transistors 402.2, 402.3, 404.1, 404.2, in a similar manner as discussed above with respect to the DPA driver cell 200.

Further, the driver signals 410.1, 410.2 may be supplied to the p-channel DPA cell 200 and identified with the input signals 210.1, 210.2 as shown in FIG. 2A. The left side of the DPA level shifting circuit 400 as shown in FIG. 4 may have a configuration of transistors identical to or substantially similar to those associated with the DPA driver cell 220, which may be referred to as an n-channel driver cell 220 in this scenario. Moreover, the driver signals 430.1, 430.2 may be supplied to the n-channel DPA cell 220 and identified with the input signals 230.1, 230.2 as shown in FIG. 2B. Again, the DPA driver cells 200, 220 may have an identical architecture and/or configuration, and thus the left and right sides of the DPA level shifting circuit 400 may likewise have an identical architecture and/or configuration, with the difference between their operation being the result of the signals received at each respective input as further discussed herein. Thus, the left side of the DPA level shifting circuit 400 includes a first capacitive feedback path comprising the capacitive voltage divider formed by the transistors 426.1, 426.2, 422.3, 424.1. The right side of the DPA level shifting circuit 400 also includes a second or voltage stabilizing feedback path comprising the transistors 428.1, 428.2 and the source-drain connections of the respectively coupled transistors 422.2, 422.3, 424.1, 424.2, in a similar manner as discussed above with respect to the DPA driver cell 220.

The DPA level shifting circuit 400 also generates the DC bias voltages, which in the non-limiting illustration of FIG. 4 includes the level-shifted DC bias voltages of 2×Vd,max, 1.5×Vd,max, and Vd,max. Each of the DC bias voltages and the driver signals 410.1, 410.2, 430.1, 430.2 may be coupled to the p-channel DPA driver cell 200 and the n-channel DPA driver cell 220 directly or via the DPA pre-driver cell 300 as shown and discussed herein with reference to FIG. 3. In other words, the DPA pre-driver cell 300, when implemented, functions as a buffer circuit between the DPA level shifting circuit 400 and each of the p-channel DPA driver cell 200 and n-channel DPA driver cell 220. Of course, the DPA level shifting circuit 400 may also be implemented with DPA driver cells 200, 220 in a single-ended signal DTX implementation versus a differential signal implementation.

The DPA level shifting circuit 400 includes a logical NAND gate 429 and a logical NOR gate 430, each of which utilizes the Vd,max voltage as its supply voltage. The NAND gate 429 and the NOR gate 430 enable amplitude control for each DPA driver cell by applying DATA=1/0, DATA_b=0/1, thereby turning the respectively coupled DPA driver cell ON/OFF, respectively. This amplitude control enables the contribution of each DPA driver cell 200, 220 to be controlled as part of an array of DPA cells used in an RF-DAC configuration, as noted herein. The NAND gate 429 receives clocked data (data) at one of its inputs as well as a local oscillator (LO) signal for the n-channel (LO_n). The clocked data signals data and data_b data streams provided by a suitable upstream component of the DTX device, such as a high-speed digital interface or local digital decoder, converting the output of a digital front end (DFE). The DFE may be implemented as a chip interface or any suitable off-chip device configured to send the data/data_b streams, which may constitute commands or digital instructions. In any event, the data and data_b signals may represent digital data that is to be transmitted, such as in-phase and quadrature phase data streams. Alternatively, and if a polar transmitter architecture is implemented, the data/data_b digital data streams may constitute commands representing an amplitude word. The amplitude word may be a representation of SQRT(I^2+Q^2), in which I and Q are the in-phase and quadrature data streams. The data and data_b data streams may represent inversions of one another, i.e. these data signals may be phase-shifted 180 degrees with respect to one another.

The LO_n and LO_p signals may be equal in frequency and phase-shifted from one another by 180 degrees. The NAND gate 429 thus generates at its output the driver signal 430.2, which represents the result of a logical NAND function applied to the data and LO_n clock signals. Due to its supply voltage of Vd,max, the NAND gate 429 generates the driver signal 430.2 having a voltage swing (i.e. peak-to-peak amplitude) approximately equal to the supply voltage of Vd,max. Likewise, the NOR gate 430 generates at its output the driver signal 410.2, which is represents the logical NOR function applied to the data_b and LO_p clock signals. Thus, the NOR gate 430 generates the driver signal 410.2 having a voltage swing (i.e. peak-to-peak amplitude) approximately equal to the supply voltage of Vd,max.

The driver signals 430.2, 410.2 are coupled to the gate terminals of each of the transistors 424.3, 404.3, respectively. The driver signal 410.2 is also coupled to the gate terminal of the transistor 204.3 of the p-channel DPA driver cell 200 as shown in FIG. 2A, either directly or via coupling to the DPA pre-driver cell 300 as noted above with reference to FIG. 3. Moreover, the driver signal 430.2 is also coupled to the gate terminal of the transistor 224.3 of the n-channel DPA driver cell 220 as shown in FIG. 2B, either directly or via coupling to the DPA pre-driver cell 300 as noted above with reference to FIG. 3. Thus, the driver signals 410.2, 430.2 may be identified in this way with the input signals 210.2, 230.2 as shown and described above with reference to the p-channel DPA driver cell 200 and the n-channel DPA driver cell 200 as shown in FIGS. 2A-2B, respectively.

As a result of the logical function applied by each of the NAND gate 429 and the NOR gate 430, the driver signals 410.1, 410.2 have the same phase as one another, and the driver signals 430.1, 430.2 have the same phase as one another. However, the driver signals 410.1, 410.2 are phase-shifted from the driver signals 430.1, 430.2 by 180 degrees, which is also illustrated in FIGS. 2A-2B with respect to the input signals 210.1, 210.2, 230.1, 230.2. The level shifting circuit 400 also includes capacitors 450, 452, which function as feedback capacitors to improve the speed of the level-shifting circuit 400. To do so, and as shown in FIG. 4, the capacitors 450, 452 function to apply a "shortcut" path to change the voltage level output by the PMOS transistors 402.1, 422.1. Thus, when the NOR gate 430 and the NAND gate 429 are switched, their respective output signals 410.2, 430.2 drive both the lower NMOS transistors 404.3, 424.3 and the upper PMOS transistors 402.1, 422.1 via the capacitors 450, 452. The level shifting circuit 400 also implements a cross-coupling configuration as shown in FIG. 4, which couples the driver signals 430.2, 410.2 to the opposite n-channel and p-channel driving sides of the level shifting circuit 400. As shown in FIG. 4, the driver signal 430.2 is coupled (after the capacitor 450) to the drain node of the transistor 402.1, and the driver signal 410.2 is coupled (after the capacitor 452) to the drain node of the transistor 422.1.

Due to the 180 degree phase difference between the driver signals 430.2, 410.2, this prevents the transistors 402.1, 422.1 from having a voltage across any of their respective gate, drain, or source terminals exceeding Vd,max. Furthermore, the effect of the coupling of the out-of-phase signals in this manner enables the output of the transistors 402.1, 422.1 to have the same voltage swing (i.e. peak-to-peak amplitude) as the driver signals 410.2, 430.2, respectively, but DC level-shifted. That is, the driver signals 410.1, 430.1 may each vary between 2×Vd,max and 3×Vd,max as the source node of each of the transistors 402.1, 422.1 is coupled to the higher voltage level of 3×Vd,max as shown in FIG. 4.

The DPA level shifting circuit 400, like the DPA driver cells 200, 220, self-generates the DC bias voltages as a proportion of the supply voltage VDD and the number of transistors 402, 404, 422, and 424. Again, this is a result of the floating gate configuration of the transistors 402, 404, 422, 424. The illustrated DPA level shifting circuit 400 as shown in FIG. 4 is non-limiting, and may include any suitable number of transistors to meet the needs of a particular design, application, and/or to match a configuration of the DPA driver cells 200, 220 and provide the appropriate number and level of DC bias voltages.

However, without the use of the voltage stabilizing feedback paths as noted above, the nature of the floating gates in this topology leads to poorly defined voltages at the capacitive node between the voltage divider formed by the first feedback paths. Thus, the secondary or voltage stabilizing feedback paths, as noted herein, also function to stabilize the voltages for the level shifting circuit 400 in the same manner as noted above for the DPA driver cells 200, 220.

To provide an illustrative example, in an "off" state, i.e. when there are no clock pulses generated to provide the LO_n and LO_p signals, the driver signal 430.2 output via the logical NAND gate 429 has some predetermined voltage logic value, such as a logic low '0', whereas the driver signal 410.2 output via the logical NOR gate 430 has a complementary logic value such as a logic high or '1.' Continuing this illustrative scenario for the left side of the DPA level shifting circuit 400, the other side of the capacitor 450 in this case, which is identified with the driver signal 430.1, holds a voltage value of either 2×Vd,max or 3×Vd,max due to the initial floating gate conditions and the residual charge on the capacitor 450. However, once the driver signal 430.1 reaches a voltage value of 3×Vd,max, then the transistor 428.1 conducts and the transistor 428.2 remains in a non-conducting state, thereby stabilizing the capacitive node voltage (i.e. the node formed between the coupled gates of the transistors 422.3, 424.1) at a defined DC voltage of 2×Vd,max. Expanding this same illustrative scenario to the right side of the DPA level shifting circuit 400, the logical 1 value output by the NOR gate 430 results in the transistor 408.2 conducting, whereas the transistor 408.01 remains in a non-conducting state. This stabilizes the capacitive node voltage (i.e. the node formed between the coupled gates of the transistors 402.3, 404.1) at a defined DC voltage of Vd,max.

Once the DPA level shifting circuit 400 is active, i.e. the clock signals LO_n and LO_p are driven at a defined LO frequency, then first and the second feedback paths continue to work together to provide the driver signals 430.1, 430.2, 410.1, 410.2 as discussed above. However, the voltage stabilizing feedback path results in the capacitive node voltages being well defined as noted above, which enables the DPA level shifting circuit 400 to quickly come to a steady state and to avoid the dynamic affects due to dynamic voltage behavior. That is, since the biases are generated from bias generator circuit, like diode divider or any other topology, it may suffer some voltage drops during operation resulting in dynamic affects due to output stage voltages not stabilized. Also, since leakage may change the capacitive divider floating nets voltage, the transistors 428.1, 428.2, 408.1, 408.2 ensure proper biasing to the capacitive divider (e.g. the capacitive node) at any time. The DPA driver cells 200, 220, which again have a similar or identical topology as the portions of the DPA level shifting circuit 400, may function in a similar manner to provide stabilized capacitive node voltages as part of each respective first feedback path.

A Differential DPA Driver Cell

Figure 5:
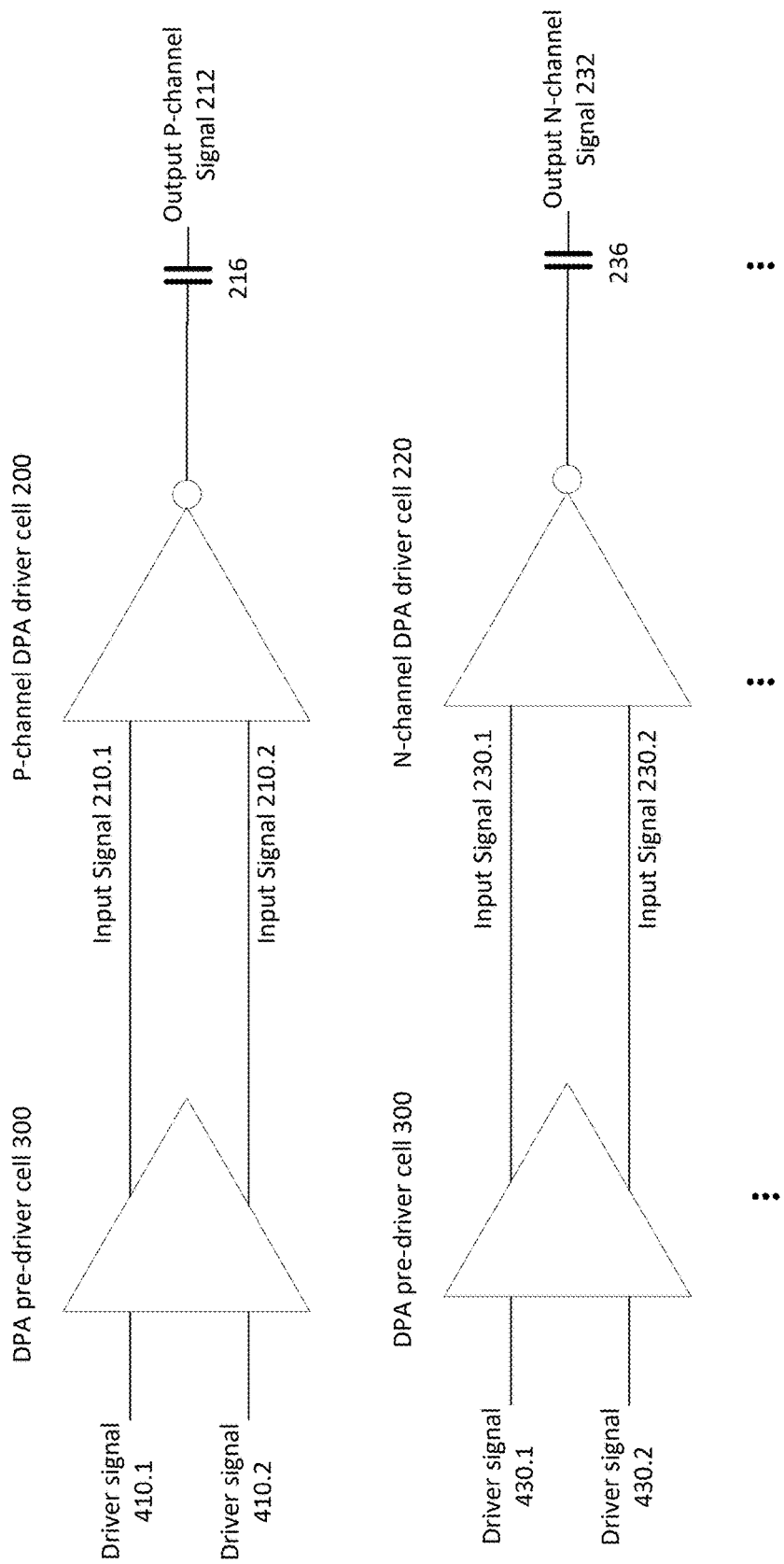
FIG. 5 illustrates an exemplary differential DPA driver cell architecture in accordance with the disclosure.

FIG. 5 illustrates a differential DPA driver cell, in accordance with the disclosure. The differential DPA driver cell 500 as shown in FIG. 5 illustrates an alternate view of the DPA driver cells 200, 220, each being driven by a respective DPA pre-driver cell 300 as shown in FIG. 3. The differential DPA driver cell 500 receives each of the driver signals 410.1, 410.2, 430.1, 430.2 as discussed herein with reference to the level shifting circuit 400 as shown in FIG. 4. Of course, the DPA pre-driver cell 300 is an optional component, and the driver signals 410.1, 410.2, 430.1, 430.2 may alternatively be coupled directly to each respective one the p-channel DPA driver cell 200 and n-channel DPA driver cell 220. In any event, each branch of the differential DPA driver cell 500 outputs a respective p-channel and n-channel output signal 212, 232, which are out of phase with one another by 180 degrees. The differential DPA driver cell 500 may be one such cell in an array of cells associated with a DTX architecture, such that the output signals 212, 232 are respectively combined from each DPA cell's output via the multiplicative capacitors 216, 236 in addition to appropriate analog-conversion circuitry such as an RF-DAC as noted above. That is, the output capacitors of each DPA driver cell in the array are all combined to a suitable output combiner that collect the energy delivered from each of the DPA driver cells. The combiner circuitry may be part of the RF-DAC or other suitable components and additional details are not shown for purposes of brevity.

Dual Feedback Path Performance

Figure 6A:
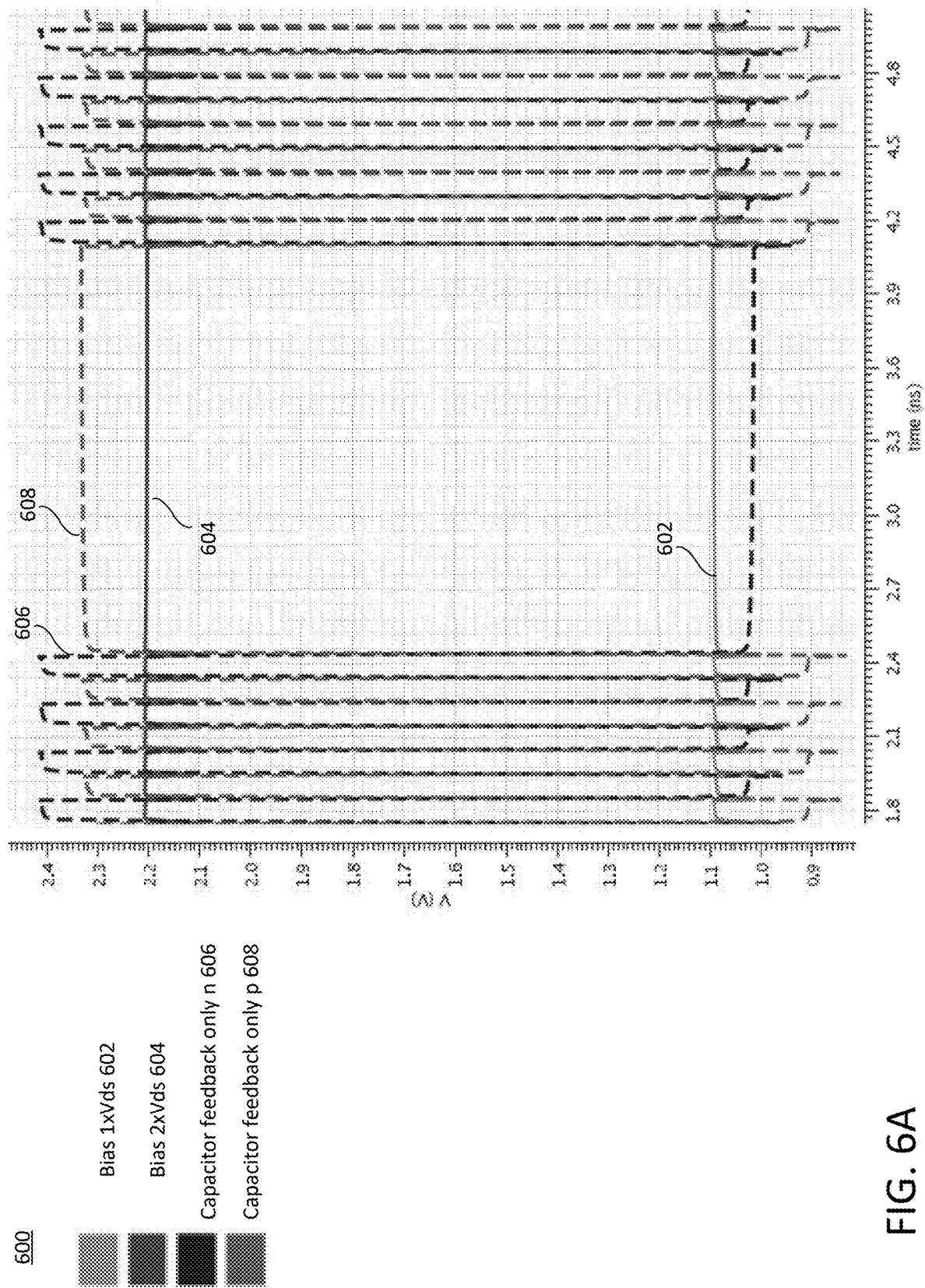
FIG. 6A illustrates an exemplary graph of a feedback capacitor voltage over time with a single feedback path, in accordance with the disclosure.

FIG. 6A illustrates a graph of a feedback capacitor voltage over time with a single feedback path, in accordance with the disclosure. That is, FIG. 6A illustrates the operation of the DPA driver cells 200, 220 in the absence of the voltage stabilizing feedback path as described herein. For the graph 600 as shown in FIG. 6A, 1×Vd,max is equal to Vds, which is 1.1 Volts, and thus 2×Vds is assumed to be 2.2 Volts. Thus, the traces 602 and 604 correspond, respectively, to the self-generated bias voltages Vd,max and 2×Vd,max for the DPA driver cells 200, 220 as shown in FIGS. 2A and 2B. The trace 606 corresponds to the voltage at the capacitive node 250 of the DPA driver cell 200, whereas the trace 608 corresponds to the voltage at the capacitive node 250 of the complementary DPA driver cell 220, as shown in FIG. 2B.

From FIG. 6A it is shown that the capacitive feedback (i.e. the voltage values) is not symmetrical around the biases. Moreover, from the graph 600 it is observed that there is a slow charging/discharging response of the floating capacitor. Thus, each clock cycle in which the DPA driver cells 220, 220 are turned on and off, the DPA driver cell 200, 220 cell initiates working at different bias point for the capacitive divider feedback. All of these effects add to the floating gates design rule problem, which also must be addressed to avoid reliability/stress concerns during manufacturing.

Figure 6B:
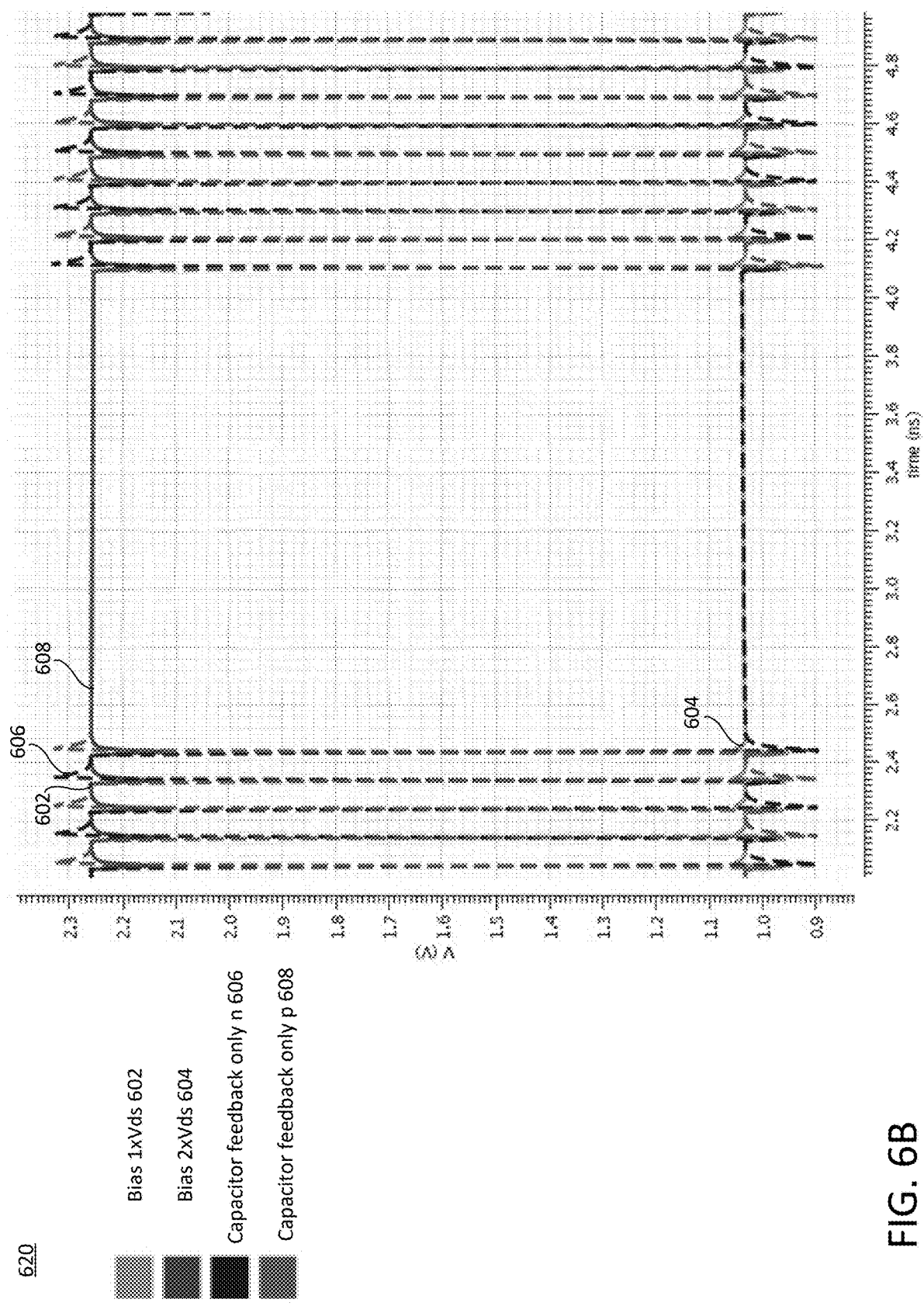
FIG. 6B illustrates an exemplary graph of a feedback capacitor voltage over time with dual feedback paths, in accordance with the disclosure.

FIG. 6B illustrates a graph of a feedback capacitor voltage over time with dual feedback paths, in accordance with the disclosure. The traces and voltages as shown in FIG. 6B correspond with those as shown in FIG. 6A. However, the graph 620 represents these traces for the topologies as shown for the DPA driver cells 200, 220 with the additional voltage stabilizing feedback path as discussed herein. FIG. 6B illustrates that the capacitive feedback (i.e. the voltage at the capacitive node 250) now tracks the static biases.

Another behavior that is observed is the static behavior between ON/OFF states of the DPA driver cells 200, 220, allowing for well-defined initial conditions. Additionally, as the feedback capacitor voltage better track the biases, parasitic offsets of the capacitive divider are reduced, which better ensures accurate voltage division, thus strengthening reliability by ensuring proper voltage drop on each of the stacked devices, both in the ON/OFF states. This is particularly useful as bias generator topologies typically provide little power during the switching operations to avoid bias dynamic behavior. Finally, the biases as shown in FIG. 6B also ensure a proper clipping mechanism, thus allowing for fast capacitive feedback voltages and well defined boundaries during operation and in the off state.

Dual Feedback Path Unit Cell Architecture and Tuning Capabilities

Figure 7:
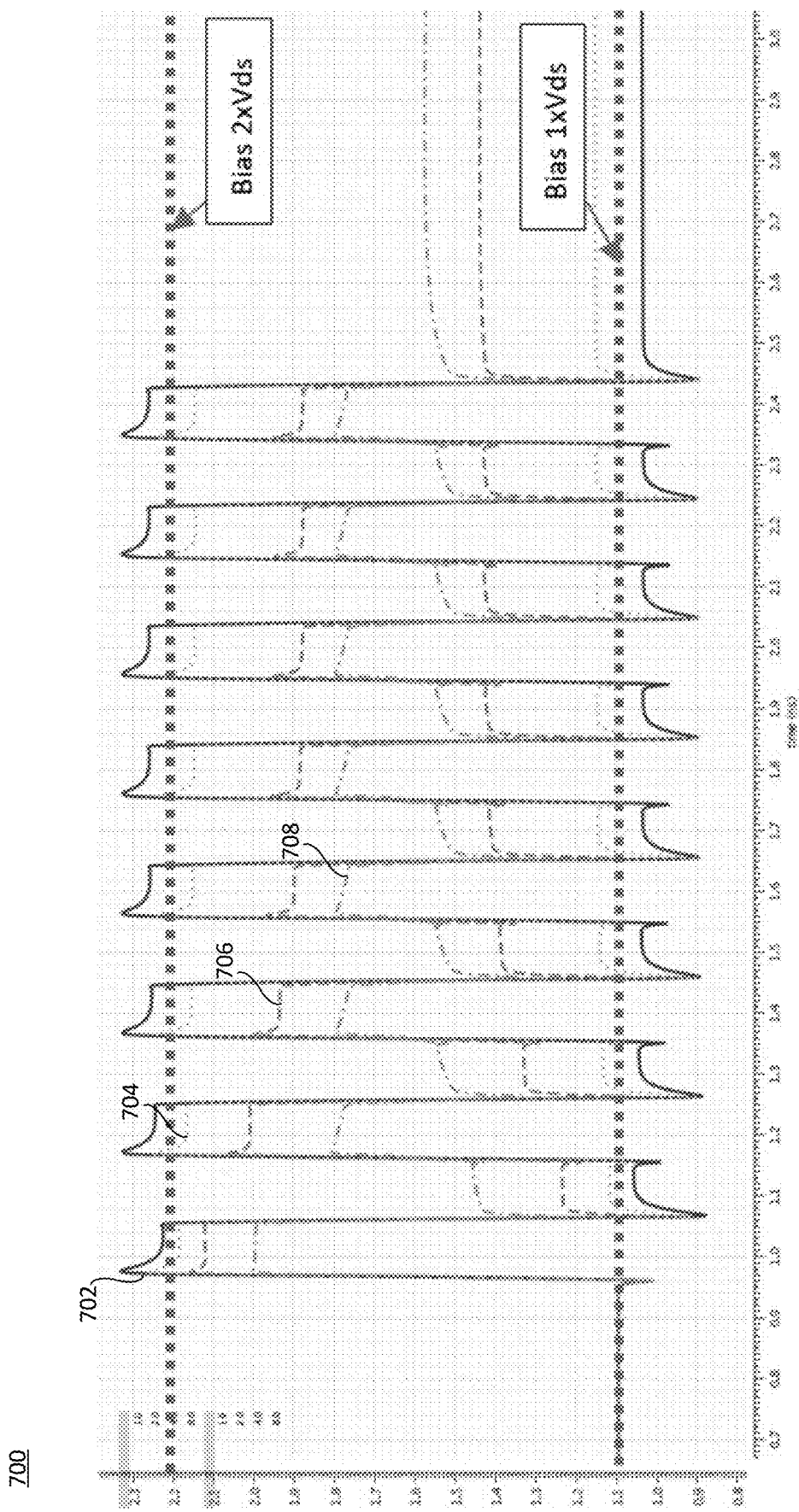
FIG. 7 illustrates the impact of transistor unit cell architecture within a voltage stabilizing path on the capacitive node voltage, in accordance with the disclosure.

FIG. 7 illustrates the impact of transistor unit cell architecture within the voltage stabilizing path on the capacitive node voltage, in accordance with the disclosure. It is noted that for the stabilizing feedback path implemented via the DPA driver cells 200, 220, as well as that implemented via the DPA level shifting circuit 400, the topology of the switching transistors, i.e. the transistors 208.1, 208.2, 228.1, 228.2, 408.1, 408.2, 428.1, 428.2, etc., may impact the capacitive divider voltages and thus influence the voltage of the capacitive node 250 in each case. To provide an illustrative and non-limiting scenario with respect to the DPA cell 200, the transistors 208.1, 208.2 may represent a set or pair of transistors identified with what is referred to herein as a "unit cell." This unit cell may include any suitable number of transistors in parallel with one another per respective transistor 208.1, 208.2, such that each of the transistors 208.1, 208.2 may be functionally implemented via a single transistor or any suitable number of transistors coupled in parallel.

That is, the transistors 208.1, 208.2 may be implemented as part of a silicon or semiconductor manufacturing technique such that the transistor 208.1 is implemented as a single transistor, and the transistor 208.2 is likewise implemented as a single transistor. In this configuration, the transistors 208.1, 208.2 are referred to as representing 1 unit cell. However, each of the transistors 208.1, 208.2 may alternatively be implemented respectively as two, three, four, eight, etc., transistors in parallel with one another. In these alternative scenarios, the transistors 208.1, 208.2 are referred to as being representative of a unit cell that indicates the number of the parallel transistors in each case that are used to implement, respectively, each of the transistors 208.1, 208.2. This is typically part of the silicon implementation using generally known processes, and thus the details regarding the configuration of transistor unit cells are omitted for purposes of brevity. Any of the transistors discussed herein may be implemented using such manufacturing techniques, which may be particularly useful however for the transistors identified with the voltage stabilizing feedback path for the DPA cells 200, 220 and the DPA level shifting circuit 400 as discussed herein. Moreover, the number of unit cells used to implement the transistors 208.1, 208.2, 228.1, 228.2, 408.1, 408.2, 428.1, 428.2 in the driver cells 200, 220, and/or the DPA level shifting circuit 400 as discussed herein may be equal to one another or differ from one another.

The number of unit cells in the voltage stabilizing path, i.e. the number of parallel transistors as noted above, results in an increase in size of each respective transistor implemented in this manner. This increased transistor size, in turn, impacts the capacitive feedback of the first feedback path as noted above by adjusting the capacitive divider. This results in an adjustment to the voltage provided at the capacitive node 250 that is a result of the selective switching of the respective transistors 208.1, 208.2, 228.1, 228.2, 408.1, 408.2, 428.1, 428.2, etc. within the voltage stabilizing feedback path. Thus, the number of unit cells (i.e. the increased size of the transistors) alters the limiting or clamping nature of the voltage stabilizing path such that the range of voltages provided at the capacitive node 250 is adjusted from the range defined by the self-generated bias voltages. In one illustrative scenario, this may include adjusting the voltage at the capacitive node 250 to range from an upper voltage level of 2×Vd,max to a slightly lower voltage (2×Vd,max−Vdelta1) when the respective transistor conducts (i.e. transistors 208.1, 228.1, 408.1, 428.1), whereas the lower voltage level at the capacitive node 250 is also adjusted from Vd,max to a slightly higher voltage (Vd,max+Vdelta2) when the other complementary transistor conducts (i.e. transistors 208.2, 228.2, 408.2, 428.2).

An example of the effect of the unit cell topology within the voltage stabilizing feedback path on the voltage provided at the capacitive node 250 is shown in further detail in FIG. 7. As was the case for FIGS. 6A and 6B, the trace in FIG. 7 also assumes that the Vd,max=Vds. The trace 702 corresponds to the voltage of the capacitive node 250 over time for a single unit cell implementation, and traces 704, 706, and 708 represent the voltage of the capacitive node 250 over time for transistor topologies corresponding to 2, 4, and 8 unit cells, respectively. From FIG. 7, it is shown that the increased size of the transistors in the voltage stabilizing feedback path results in a shift of the range of voltages provided at the capacitive node 250.

Therefore, the size of the transistors in the voltage stabilizing feedback path may be advantageously used to fine tune the range of voltages provided at the capacitive node 250, which may be particular useful to adapt the DPA architecture across different applications. However, it is noted that in doing so should design constrains related to tracking speed should be considered, as well as the additional current drop from the generated DC voltage biases. By increasing the size of the transistors in the voltage stabilizing feedback path, too much current may be drawn from the self-generator biases, causing bias generator stability issues. In addition, it is preferable that the transistors in the voltage stabilizing feedback path (i.e. the transistors 208.1, 208.2, 228.1, 228.2, 408.1, 408.2, 428.1, 428.2, etc.) be relatively small in size relative to the other implemented transistors. In this context, the voltage stabilizing feedback path transistors may be less than one half, less than one quarter, less than one tenth, less than one-twentieth, etc. compared to the size of the other transistors in the DPA cells 200, 220, and/or the DPA level shifting circuit 400 as described above.

General Operation of the DPA Driver Cells 200, 220, DPA Pre-Driver Cell 300, and the DPA Level Shifting Circuit 400

A digital power amplifier circuit is provided. With reference to FIGS. 2A-2D, FIG. 3, and FIG. 4, the digital power amplifier circuit may include a plurality of p-type transistors comprising a first p-type transistor having a gate configured to be coupled to a first signal that varies between a first voltage range; a plurality of n-type transistors comprising a first n-type transistor having a gate configured to be coupled to a second signal that varies between a second voltage range; a first feedback path comprising a first pair of transistors, each one of the first pair of transistors being coupled to a gate of a second p-type transistor from among the plurality of p-type transistors via a capacitive node, and to a gate of a second n-type transistor from among a plurality of n-type transistors via the capacitive node, thereby forming a corresponding feedback capacitive ratio; and a second feedback path comprising a second pair of transistors, each one of the second pair of transistors being configured to selectively couple a respective direct current (DC) voltage to the capacitive node, the output of the digital power amplifier circuit is configured to generate an output signal in accordance with the feedback capacitive ratio such that the output signal varies between a third voltage range that is larger than the first voltage range and the second voltage range. Furthermore, each one of the second pair of transistors is configured to selectively couple, as each respective direct current (DC) voltage, a respective one of a first DC bias voltage and a second DC bias voltage to the capacitive node. In addition or in alternative to and in any combination with the optional features previously explained in this paragraph, the first one of the second pair of transistors is configured to be coupled to the first DC bias voltage, which is equal to a lower voltage level of the first voltage range, and the second one of the second pair of transistors is configured to be coupled to a second DC bias voltage, which is equal to an upper voltage level of the second voltage range. In addition or in alternative to and in any combination with the optional features previously explained in this paragraph, a drain or source of the second p-type transistor is identified with an output terminal and coupled to a drain or source of the second n-type transistor that is identified with an output terminal to form an output node associated with the generation of the output signal, a gate of the first one of the second pair of transistors is coupled to a terminal of the second p-type transistor other than a gate terminal or the output terminal, and a gate of the second one of the second pair of transistors is coupled to a terminal of the second n-type transistor other than a gate terminal or the output terminal. In addition or in alternative to and in any combination with the optional features previously explained in this paragraph, the second one of the plurality of p-type transistors has a floating gate that is coupled to a floating gate of the second one of the plurality of n-type transistors. In addition or in alternative to and in any combination with the optional features previously explained in this paragraph, a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage. In addition or in alternative to and in any combination with the optional features previously explained in this paragraph, the digital power amplifier circuit further comprises level shifting circuitry configured to generate the first signal and the second signal having the same peak-to-peak amplitude but being direct-current (DC) level-shifted with respect to one another. In addition or in alternative to and in any combination with the optional features previously explained in this paragraph, the level shifting circuitry comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively. In addition or in alternative to and in any combination with the optional features previously explained in this paragraph, the level shifting circuitry is configured to generate a first DC bias voltage via one of the second plurality of p-type transistors, to generate a second DC bias voltage via one of the second plurality of n-type transistors, and to generate a third DC bias voltage via the third pair of transistors, and the first, second, and third DC bias voltages are coupled to a respectively configured transistor from among the plurality of p-type transistors, the plurality of n-type transistors, and the first pair of transistors. In addition or in alternative to and in any combination with the optional features previously explained in this paragraph, each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

A digital power amplifier driver cell is provided. The digital power amplifier driver cell may include a plurality of p-type transistors comprising a first p-type transistor having a gate configured to be coupled to a first signal that varies between a first voltage range; a plurality of n-type transistors comprising a first n-type transistor having a gate configured to be coupled to a second signal that varies between a second voltage range; a first feedback path comprising a first pair of transistors, each one of the first pair of transistors being coupled to a gate of a second p-type transistor from among the plurality of p-type transistors via a capacitive node, and to a gate of a second n-type transistor from among a plurality of n-type transistors via the capacitive node, thereby forming a corresponding feedback capacitive ratio; and a second feedback path comprising a second pair of transistors, each one of the second pair of transistors being configured to selectively couple a respective direct current (DC) voltage to the capacitive node, and the output of the digital power amplifier circuit is configured to generate an output signal in accordance with the feedback capacitive ratio such that the output signal varies between a third voltage range that is larger than the first voltage range and the second voltage range. Furthermore, each one of the second pair of transistors is configured to selectively couple, as each respective direct current (DC) voltage, a respective one of a first DC bias voltage and a second DC bias voltage to the capacitive node. In addition or in alternative to and in any combination with the optional features previously explained in this paragraph, the first one of the second pair of transistors is configured to be coupled to the first DC bias voltage, which is equal to a lower voltage level of the first voltage range, and the second one of the second pair of transistors is configured to be coupled to a second DC bias voltage, which is equal to an upper voltage level of the second voltage range. In addition or in alternative to and in any combination with the optional features previously explained in this paragraph, a drain or source of the second p-type transistor is identified with an output terminal and coupled to a drain or source of the second n-type transistor that is identified with an output terminal to form an output node associated with the generation of the output signal, a gate of the first one of the second pair of transistors is coupled to a terminal of the second p-type transistor other than a gate terminal or the output terminal, and a gate of the second one of the second pair of transistors is coupled to a terminal of the second n-type transistor other than a gate terminal or the output terminal. In addition or in alternative to and in any combination with the optional features previously explained in this paragraph, the second one of the plurality of p-type transistors has a floating gate that is coupled to a floating gate of the second one of the plurality of n-type transistors. In addition or in alternative to and in any combination with the optional features previously explained in this paragraph, a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage. In addition or in alternative to and in any combination with the optional features previously explained in this paragraph, the digital power amplifier driver cell is coupled to level shifting circuitry configured to generate the first signal and the second signal having the same peak-to-peak amplitude but being direct-current (DC)

level-shifted with respect to one another. In addition or in alternative to and in any combination with the optional features previously explained in this paragraph, the level shifting circuitry comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively. In addition or in alternative to and in any combination with the optional features previously explained in this paragraph, the level shifting circuitry is configured to generate a first DC bias voltage via one of the second plurality of p-type transistors, to generate a second DC bias voltage via one of the second plurality of n-type transistors, and to generate a third DC bias voltage via the third pair of transistors, and the first, second, and third DC bias voltages are coupled to a respectively configured transistor from among the plurality of p-type transistors, the plurality of n-type transistors, and the first pair of transistors. In addition or in alternative to and in any combination with the optional features previously explained in this paragraph, each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

EXAMPLES

The following examples pertain to various techniques of the present disclosure.

An example (e.g. example 1) relates to a digital power amplifier circuit, comprising: a plurality of p-type transistors comprising a first p-type transistor having a gate configured to be coupled to a first signal that varies between a first voltage range; a plurality of n-type transistors comprising a first n-type transistor having a gate configured to be coupled to a second signal that varies between a second voltage range; a first feedback path comprising a first pair of transistors, each one of the first pair of transistors being coupled to a gate of a second p-type transistor from among the plurality of p-type transistors via a capacitive node, and to a gate of a second n-type transistor from among a plurality of n-type transistors via the capacitive node, thereby forming a corresponding feedback capacitive ratio; and a second feedback path comprising a second pair of transistors, each one of the second pair of transistors being configured to selectively couple a respective direct current (DC) voltage to the capacitive node, wherein the output of the digital power amplifier circuit is configured to generate an output signal in accordance with the feedback capacitive ratio such that the output signal varies between a third voltage range that is larger than the first voltage range and the second voltage range.

Another example (e.g. example 2) relates to a previously-described example (e.g. example 1), wherein each one of the second pair of transistors is configured to selectively couple, as each respective direct current (DC) voltage, a respective one of a first DC bias voltage and a second DC bias voltage to the capacitive node.

Another example (e.g. example 3) relates to a previously-described example (e.g. one or more of examples 1-2), wherein the first one of the second pair of transistors is configured to be coupled to the first DC bias voltage, which is equal to a lower voltage level of the first voltage range, and wherein the second one of the second pair of transistors is configured to be coupled to a second DC bias voltage, which is equal to an upper voltage level of the second voltage range.

Another example (e.g. example 4) relates to a previously-described example (e.g. one or more of examples 1-3), wherein: a drain or source of the second p-type transistor is identified with an output terminal and coupled to a drain or source of the second n-type transistor that is identified with an output terminal to form an output node associated with the generation of the output signal, a gate of the first one of the second pair of transistors is coupled to a terminal of the second p-type transistor other than a gate terminal or the output terminal, and a gate of the second one of the second pair of transistors is coupled to a terminal of the second n-type transistor other than a gate terminal or the output terminal.

Another example (e.g. example 5) relates to a previously-described example (e.g. one or more of examples 1-4), wherein the second one of the plurality of p-type transistors has a floating gate that is coupled to a floating gate of the second one of the plurality of n-type transistors.

Another example (e.g. example 6) relates to a previously-described example (e.g. one or more of examples 1-5), wherein: a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage.

Another example (e.g. example 7) relates to a previously-described example (e.g. one or more of examples 1-6), further comprising: level shifting circuitry configured to generate the first signal and the second signal having the same peak-to-peak amplitude but being direct-current (DC) level-shifted with respect to one another.

Another example (e.g. example 8) relates to a previously-described example (e.g. one or more of examples 1-7), wherein the level shifting circuitry comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively.

Another example (e.g. example 9) relates to a previously-described example (e.g. one or more of examples 1-8), wherein the level shifting circuitry is configured to generate a first DC bias voltage via one of the second plurality of p-type transistors, to generate a second DC bias voltage via one of the second plurality of n-type transistors, and to generate a third DC bias voltage via the third pair of transistors, and wherein the first, second, and third DC bias voltages are coupled to a respectively configured transistor from among the plurality of p-type transistors, the plurality of n-type transistors, and the first pair of transistors.

Another example (e.g. example 10) relates to a previously-described example (e.g. one or more of examples 1-9), wherein each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

An example (e.g. example 11) relates to digital power amplifier driver cell, comprising: a plurality of p-type transistors comprising a first p-type transistor having a gate configured to be coupled to a first signal that varies between a first voltage range; a plurality of n-type transistors comprising a first n-type transistor having a gate configured to be coupled to a second signal that varies between a second voltage range; a first feedback path comprising a first pair of transistors, each one of the first pair of transistors being coupled to a gate of a second p-type transistor from among the plurality of p-type transistors via a capacitive node, and to a gate of a second n-type transistor from among a plurality of n-type transistors via the capacitive node, thereby forming a corresponding feedback capacitive ratio; and a second feedback path comprising a second pair of transistors, each one of the second pair of transistors being configured to selectively couple a respective direct current (DC) voltage to the capacitive node, wherein the output of the digital power amplifier circuit is configured to generate an output signal in accordance with the feedback capacitive ratio such that the output signal varies between a third voltage range that is larger than the first voltage range and the second voltage range.

Another example (e.g. example 12) relates to a previously-described example (e.g. example 11), wherein each one of the second pair of transistors is configured to selectively couple, as each respective direct current (DC) voltage, a respective one of a first DC bias voltage and a second DC bias voltage to the capacitive node.

Another example (e.g. example 13) relates to a previously-described example (e.g. one or more of examples 11-12), wherein the first one of the second pair of transistors is configured to be coupled to the first DC bias voltage, which is equal to a lower voltage level of the first voltage range, and wherein the second one of the second pair of transistors is configured to be coupled to a second DC bias voltage, which is equal to an upper voltage level of the second voltage range.

Another example (e.g. example 14) relates to a previously-described example (e.g. one or more of examples 11-13), wherein: a drain or source of the second p-type transistor is identified with an output terminal and coupled to a drain or source of the second n-type transistor that is identified with an output terminal to form an output node associated with the generation of the output signal, a gate of the first one of the second pair of transistors is coupled to a terminal of the second p-type transistor other than a gate terminal or the output terminal, and a gate of the second one of the second pair of transistors is coupled to a terminal of the second n-type transistor other than a gate terminal or the output terminal.

Another example (e.g. example 15) relates to a previously-described example (e.g. one or more of examples 11-14), wherein the second one of the plurality of p-type transistors has a floating gate that is coupled to a floating gate of the second one of the plurality of n-type transistors.

Another example (e.g. example 16) relates to a previously-described example (e.g. one or more of examples 11-15), wherein: a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage.

Another example (e.g. example 17) relates to a previously-described example (e.g. one or more of examples 11-16), wherein the digital power amplifier driver cell is coupled to level shifting circuitry configured to generate the first signal and the second signal having the same peak-to-peak amplitude but being direct-current (DC) level-shifted with respect to one another.

Another example (e.g. example 18) relates to a previously-described example (e.g. one or more of examples 11-17), wherein the level shifting circuitry comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively.

Another example (e.g. example 19) relates to a previously-described example (e.g. one or more of examples 11-18), wherein the level shifting circuitry is configured to generate a first DC bias voltage via one of the second plurality of p-type transistors, to generate a second DC bias voltage via one of the second plurality of n-type transistors, and to generate a third DC bias voltage via the third pair of transistors, and wherein the first, second, and third DC bias voltages are coupled to a respectively configured transistor from among the plurality of p-type transistors, the plurality of n-type transistors, and the first pair of transistors.

Another example (e.g. example 20) relates to a previously-described example (e.g. one or more of examples 11-19), wherein each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

An example (e.g. example 21) relates to a digital power amplifier means, comprising: a plurality of p-type transistors comprising a first p-type transistor having a gate configured to be coupled to a first signal that varies between a first voltage range; a plurality of n-type transistors comprising a first n-type transistor having a gate configured to be coupled to a second signal that varies between a second voltage range; a first feedback means comprising a first pair of transistors, each one of the first pair of transistors being coupled to a gate of a second p-type transistor from among the plurality of p-type transistors via a capacitive node, and to a gate of a second n-type transistor from among a plurality of n-type transistors via the capacitive node, thereby forming a corresponding feedback capacitive ratio; and a second feedback means comprising a second pair of transistors, each one of the second pair of transistors being configured to selectively couple a respective direct current (DC) voltage to the capacitive node, wherein the output of the digital power amplifier means is configured to generate an output signal in accordance with the feedback capacitive ratio such that the output signal varies between a third voltage range that is larger than the first voltage range and the second voltage range.

Another example (e.g. example 22) relates to a previously-described example (e.g. example 21), wherein each one of the second pair of transistors is configured to selectively couple, as each respective direct current (DC) voltage, a respective one of a first DC bias voltage and a second DC bias voltage to the capacitive node.

Another example (e.g. example 23) relates to a previously-described example (e.g. one or more of examples 21-22), wherein the first one of the second pair of transistors is configured to be coupled to the first DC bias voltage, which is equal to a lower voltage level of the first voltage range, and wherein the second one of the second pair of transistors is configured to be coupled to a second DC bias voltage, which is equal to an upper voltage level of the second voltage range.

Another example (e.g. example 24) relates to a previously-described example (e.g. one or more of examples 21-23), wherein: a drain or source of the second p-type transistor is identified with an output means and coupled to a drain or source of the second n-type transistor that is identified with an output means to form an output node associated with the generation of the output signal, a gate of the first one of the second pair of transistors is coupled to a terminal of the second p-type transistor other than a gate terminal or the output means, and a gate of the second one of the second pair of transistors is coupled to a terminal of the second n-type transistor other than a gate terminal or the output means.

Another example (e.g. example 25) relates to a previously-described example (e.g. one or more of examples 21-24), wherein the second one of the plurality of p-type transistors has a floating gate that is coupled to a floating gate of the second one of the plurality of n-type transistors.

Another example (e.g. example 26) relates to a previously-described example (e.g. one or more of examples 21-25), wherein: a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage.

Another example (e.g. example 27) relates to a previously-described example (e.g. one or more of examples 21-26), further comprising: level shifting means for generating the first signal and the second signal having the same peak-to-peak amplitude but being direct-current (DC) level-shifted with respect to one another.

Another example (e.g. example 28) relates to a previously-described example (e.g. one or more of examples 21-27), wherein the level shifting means comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively.

Another example (e.g. example 29) relates to a previously-described example (e.g. one or more of examples 21-28), wherein the level shifting means generates a first DC bias voltage via one of the second plurality of p-type transistors, generates a second DC bias voltage via one of the second plurality of n-type transistors, and generates a third DC bias voltage via the third pair of transistors, and wherein the first, second, and third DC bias voltages are coupled to a respectively configured transistor from among the plurality of p-type transistors, the plurality of n-type transistors, and the first pair of transistors.

Another example (e.g. example 30) relates to a previously-described example (e.g. one or more of examples 21-29), wherein each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

An example (e.g. example 31) relates to digital power amplifier driver means, comprising: a plurality of p-type transistors comprising a first p-type transistor having a gate configured to be coupled to a first signal that varies between a first voltage range; a plurality of n-type transistors comprising a first n-type transistor having a gate configured to be coupled to a second signal that varies between a second voltage range; a first feedback means comprising a first pair of transistors, each one of the first pair of transistors being coupled to a gate of a second p-type transistor from among the plurality of p-type transistors via a capacitive node, and to a gate of a second n-type transistor from among a plurality of n-type transistors via the capacitive node, thereby forming a corresponding feedback capacitive ratio; and a second feedback means comprising a second pair of transistors, each one of the second pair of transistors being configured to selectively couple a respective direct current (DC) voltage to the capacitive node, wherein the output of the digital power amplifier circuit is configured to generate an output signal in accordance with the feedback capacitive ratio such that the output signal varies between a third voltage range that is larger than the first voltage range and the second voltage range.

Another example (e.g. example 32) relates to a previously-described example (e.g. example 31), wherein each one of the second pair of transistors is configured to selectively couple, as each respective direct current (DC) voltage, a respective one of a first DC bias voltage and a second DC bias voltage to the capacitive node.

Another example (e.g. example 33) relates to a previously-described example (e.g. one or more of examples 31-32), wherein the first one of the second pair of transistors is configured to be coupled to the first DC bias voltage, which is equal to a lower voltage level of the first voltage range, and wherein the second one of the second pair of transistors is configured to be coupled to a second DC bias voltage, which is equal to an upper voltage level of the second voltage range.

Another example (e.g. example 34) relates to a previously-described example (e.g. one or more of examples 31-33), wherein: a drain or source of the second p-type transistor is identified with an output means and coupled to a drain or source of the second n-type transistor that is identified with an output means to form an output node associated with the generation of the output signal, a gate of the first one of the second pair of transistors is coupled to a terminal of the second p-type transistor other than a gate terminal or the output means, and a gate of the second one of the second pair of transistors is coupled to a terminal of the second n-type transistor other than a gate terminal or the output means.

Another example (e.g. example 35) relates to a previously-described example (e.g. one or more of examples 31-34), wherein the second one of the plurality of p-type transistors has a floating gate that is coupled to a floating gate of the second one of the plurality of n-type transistors.

Another example (e.g. example 36) relates to a previously-described example (e.g. one or more of examples 31-35), wherein: a third one of the plurality of p-type transistors has a floating gate configured to be coupled to a first direct current (DC) bias voltage, a third one of the plurality of n-type transistors has a floating gate configured to be coupled to a second DC bias voltage, and the first bias voltage is different than the second DC bias voltage.

Another example (e.g. example 37) relates to a previously-described example (e.g. one or more of examples 31-36), wherein the digital power amplifier driver means is coupled to level shifting means for generating the first signal and the second signal having the same peak-to-peak amplitude but being direct-current (DC) level-shifted with respect to one another.

Another example (e.g. example 38) relates to a previously-described example (e.g. one or more of examples 31-37), wherein the level shifting means comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively.

Another example (e.g. example 39) relates to a previously-described example (e.g. one or more of examples 31-38), wherein the level shifting means generates a first DC bias voltage via one of the second plurality of p-type transistors, generates a second DC bias voltage via one of the second plurality of n-type transistors, and generates a third DC bias voltage via the third pair of transistors, and wherein the first, second, and third DC bias voltages are coupled to a respectively configured transistor from among the plurality of p-type transistors, the plurality of n-type transistors, and the first pair of transistors.

Another example (e.g. example 40) relates to a previously-described example (e.g. one or more of examples 31-39), wherein each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

An apparatus as shown and described.

A method as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processing circuitry" or "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processing circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. A digital power amplifier circuit, comprising:
   a plurality of p-type transistors comprising a first p-type transistor having a gate configured to be coupled to a first signal that varies between a first voltage range;
   a plurality of n-type transistors comprising a first n-type transistor having a gate configured to be coupled to a second signal that varies between a second voltage range;
   a first feedback path comprising a first pair of transistors, each one of the first pair of transistors being coupled to a gate of a second p-type transistor from among the plurality of p-type transistors via a capacitive node, and to a gate of a second n-type transistor from among the plurality of n-type transistors via the capacitive node, thereby forming a corresponding feedback capacitive ratio; and a second feedback path comprising a second pair of transistors, each one of the second pair of transistors being configured to selectively couple a respective direct current (DC) voltage to the capacitive node, wherein an output of the digital power amplifier circuit is configured to generate an output signal in accordance with the feedback capacitive ratio such that the output signal varies between a third voltage range that is larger than the first voltage range and the second voltage range.

2. The digital power amplifier circuit of claim 1, wherein each one of the second pair of transistors is configured to selectively couple, as each respective DC voltage, a respective one of a first DC bias voltage and a second DC bias voltage to the capacitive node.

3. The digital power amplifier of claim 2, wherein the first one of the second pair of transistors is configured to be coupled to the first DC bias voltage, which is equal to a lower voltage level of the first voltage range, and wherein the second one of the second pair of transistors is configured to be coupled to a second DC bias voltage, which is equal to an upper voltage level of the second voltage range.

4. The digital power amplifier of claim 2, wherein:
a drain or source of the second p-type transistor is identified with an output terminal and coupled to a drain or source of the second n-type transistor that is identified with an output terminal to form an output node associated with the generation of the output signal,
a gate of the first one of the second pair of transistors is coupled to a terminal of the second p-type transistor other than a gate terminal or the output terminal, and
a gate of the second one of the second pair of transistors is coupled to a terminal of the second n-type transistor other than a gate terminal or the output terminal.

5. The digital power amplifier circuit of claim 1, wherein the second one of the plurality of p-type transistors has a floating gate that is coupled to a floating gate of the second one of the plurality of n-type transistors.

6. The digital power amplifier circuit of claim 1, wherein:
a third one of the plurality of p-type transistors has a floating gate configured to be coupled to a first DC bias voltage,
a third one of the plurality of n-type transistors has a floating gate configured to be coupled to a second DC bias voltage, and
the first DC bias voltage is different than the second DC bias voltage.

7. The digital power amplifier of claim 1, further comprising:
level shifting circuitry configured to generate the first signal and the second signal having a same peak-to-peak amplitude but being DC level-shifted with respect to one another.

8. The digital power amplifier of claim 7, wherein the level shifting circuitry comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively.

9. The digital power amplifier of claim 8, wherein the level shifting circuitry is configured to generate a first DC bias voltage via one of the second plurality of p-type transistors, to generate a second DC bias voltage via one of the second plurality of n-type transistors, and to generate a third DC bias voltage via the third pair of transistors, and wherein each of the first DC bias voltage, the second DC bias voltage, and third DC bias voltage is coupled to a respectively configured transistor from among the plurality of p-type transistors, the plurality of n-type transistors, and the first pair of transistors, respectively.

10. The digital power amplifier of claim 6, wherein each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

11. A digital power amplifier driver cell, comprising:
a plurality of p-type transistors comprising a first p-type transistor having a gate configured to be coupled to a first signal that varies between a first voltage range;
a plurality of n-type transistors comprising a first n-type transistor having a gate configured to be coupled to a second signal that varies between a second voltage range;
a first feedback path comprising a first pair of transistors, each one of the first pair of transistors being coupled to a gate of a second p-type transistor from among the plurality of p-type transistors via a capacitive node, and to a gate of a second n-type transistor from among the plurality of n-type transistors via the capacitive node, thereby forming a corresponding feedback capacitive ratio; and
a second feedback path comprising a second pair of transistors, each one of the second pair of transistors being configured to selectively couple a respective direct current (DC) voltage to the capacitive node,
wherein an output of the digital power amplifier driver cell is configured to generate an output signal in accordance with the feedback capacitive ratio such that the output signal varies between a third voltage range that is larger than the first voltage range and the second voltage range.

12. The digital power amplifier driver cell of claim 11, wherein each one of the second pair of transistors is configured to selectively couple, as each respective DC voltage, a respective one of a first DC bias voltage and a second DC bias voltage to the capacitive node.

13. The digital power amplifier driver cell of claim 12, wherein the first one of the second pair of transistors is configured to be coupled to the first DC bias voltage, which is equal to a lower voltage level of the first voltage range, and wherein the second one of the second pair of transistors is configured to be coupled to a second DC bias voltage, which is equal to an upper voltage level of the second voltage range.

14. The digital power amplifier driver cell of claim 12, wherein:
a drain or source of the second p-type transistor is identified with an output terminal and coupled to a drain or source of the second n-type transistor that is identified with an output terminal to form an output node associated with the generation of the output signal,
a gate of the first one of the second pair of transistors is coupled to a terminal of the second p-type transistor other than a gate terminal or the output terminal, and a gate of the second one of the second pair of transistors is coupled to a terminal of the second n-type transistor other than a gate terminal or the output terminal.

15. The digital power amplifier driver cell of claim 11, wherein the second one of the plurality of p-type transistors has a floating gate that is coupled to a floating gate of the second one of the plurality of n-type transistors.

16. The digital power amplifier driver cell of claim 11, wherein:
- a third one of the plurality of p-type transistors has a floating gate configured to be coupled to a first DC bias voltage,
- a third one of the plurality of n-type transistors has a floating gate configured to be coupled to a second DC bias voltage, and
- the first DC bias voltage is different than the second DC bias voltage.

17. The digital power amplifier driver cell of claim 11, wherein the digital power amplifier driver cell is coupled to level shifting circuitry configured to generate the first signal and the second signal having a same peak-to-peak amplitude but being DC level-shifted with respect to one another.

18. The digital power amplifier driver cell of claim 17, wherein the level shifting circuitry comprises a second plurality of p-type transistors, a second plurality of n-type transistors, a third pair of transistors, and a fourth pair of transistors having the same configuration as the plurality of p-type transistors, the plurality of n-type transistors, the first pair of transistors, and the second pair of transistors, respectively.

19. The digital power amplifier driver cell of claim 18, wherein the level shifting circuitry is configured to generate a first DC bias voltage via one of the second plurality of p-type transistors, to generate a second DC bias voltage via one of the second plurality of n-type transistors, and to generate a third DC bias voltage via the third pair of transistors, and
- wherein each one of the first DC bias voltage, the DC bias voltage second, and the third DC bias voltage is coupled to a respectively configured transistor from among the plurality of p-type transistors, the plurality of n-type transistors, and the first pair of transistors, respectively.

20. The digital power amplifier driver cell of claim 16, wherein each one of the second pair of transistors is configured to selectively couple a respective one of a first voltage and a second voltage to the capacitive node to cause the capacitive node to have a voltage that deviates from the first DC bias voltage and the second DC bias voltage, respectively, based upon a size of each one of the second pair of transistors.

* * * * *